United States Patent
Kern et al.

(10) Patent No.: US 10,623,026 B2
(45) Date of Patent: Apr. 14, 2020

(54) ERROR CORRECTION

(71) Applicant: Infineon Technologies AG, Neubiberg (DE)

(72) Inventors: Thomas Kern, Aschheim (DE); Christian Badack, Potsdam (DE); Michael Goessel, Mahlow (DE)

(73) Assignee: Infineon Technologies AG, Neubiberg (DE)

( * ) Notice: Subject to any disclaimer, the term of this patent is extended or adjusted under 35 U.S.C. 154(b) by 529 days.

(21) Appl. No.: 15/337,286

(22) Filed: Oct. 28, 2016

(65) Prior Publication Data

US 2017/0126253 A1    May 4, 2017

(30) Foreign Application Priority Data

Oct. 30, 2015  (DE) .................. 10 2015 118 668

(51) Int. Cl.
 *H03M 13/15*  (2006.01)
 *H03M 13/29*  (2006.01)
 *G06F 11/10*  (2006.01)

(52) U.S. Cl.
 CPC ......... *H03M 13/2906* (2013.01); *G06F 11/10* (2013.01); *H03M 13/1525* (2013.01); *H03M 13/1545* (2013.01); *H03M 13/1575* (2013.01); *H03M 13/152* (2013.01)

(58) Field of Classification Search
 CPC .......... G11B 20/1833; H03M 13/2957; H03M 13/29; H03M 13/1515; H03M 13/2909; H03M 13/2906; H03M 13/1575; H03M 13/1545; H03M 13/1525; H03M 13/152;
 (Continued)

(56) References Cited

U.S. PATENT DOCUMENTS 5,710,782 A    1/1998  Weng
5,867,501 A *  2/1999  Horst ............... G01R 31/31727
                                                  370/474
(Continued)

FOREIGN PATENT DOCUMENTS

JP    2010154043 A    7/2010
JP    2012038226 A    2/2012

OTHER PUBLICATIONS

Wicker, Stephen B. "Error Control Systems for Digital Communication and Storage." School of Electrical and Computer Engineering Georgia Institute of Technology. 3 pages.
(Continued)

*Primary Examiner* — Albert Decady
*Assistant Examiner* — Enam Ahmed
(74) *Attorney, Agent, or Firm* — Eschweiler & Potashnik, LLC

(57) ABSTRACT

A circuit arrangement for determining a correction signal on the basis of at least one bit error of a binary word is specified, including a plurality of subcircuits (ST), wherein a respective subcircuit is provided for a bit position to be corrected of the binary word, wherein each of the subcircuits provides at least two locator polynomial values, and comprising a selection unit, which determines a correction signal depending on the locator polynomial values and depending on an error signal (err, E). A method for driving such a circuit arrangement is furthermore proposed.

27 Claims, 11 Drawing Sheets

(58) Field of Classification Search
CPC .. G06F 11/10; G06F 11/1044; G06F 11/1052; G06F 11/1068; G11C 2029/0411
USPC .......................................................... 714/755
See application file for complete search history.

(56) References Cited

U.S. PATENT DOCUMENTS

| | | | | |
|---|---|---|---|---|
| 6,058,499 A * | 5/2000 | Sim | .................... | H03M 13/1575 714/755 |
| 6,154,868 A | 11/2000 | Cox | | |
| 6,343,367 B1 | 1/2002 | Shen | | |
| 6,928,601 B2 | 8/2005 | Katayama | | |
| 7,853,853 B2 * | 12/2010 | Demirhan | .............. | H04L 1/0003 714/751 |
| 8,397,144 B1 | 3/2013 | Norrie et al. | | |
| 8,510,639 B2 * | 8/2013 | Steiner | .................. | H03M 13/09 714/755 |
| 8,875,001 B1 * | 10/2014 | Mazahreh | ......... | H03M 13/1525 714/781 |
| 2008/0140740 A1 * | 6/2008 | Williamson | ...... | H03M 13/1515 708/200 |
| 2010/0058146 A1 * | 3/2010 | Weingarten | ....... | H03M 13/1515 714/773 |
| 2012/0240013 A1 | 9/2012 | Wong | | |
| 2014/0108895 A1 | 4/2014 | Fujiwara | | |
| 2014/0181614 A1 * | 6/2014 | Kwok | ................ | H03M 13/1515 714/755 |
| 2014/0317478 A1 * | 10/2014 | Anholt | .................. | H03M 13/15 714/781 |

OTHER PUBLICATIONS

Lin, Shu et al. "Error Control Coding Fundamentals and Applications." Prentice-Hall, Inc. 1983, pp. 142-160.

* cited by examiner

Fig.10

| Power notation | Polynomial notation | Tuple notation |
|---|---|---|
| 0 | 0 | (00000) |
| $\alpha^0$ | 1 | (10000) |
| $\alpha^1$ | $x^1$ | (01000) |
| $\alpha^2$ | $x^2$ | (00100) |
| $\alpha^3$ | $x^3$ | (00010) |
| $\alpha^4$ | $x^4$ | (00001) |
| $\alpha^5$ | $1+x^2$ | (10100) |
| $\alpha^6$ | $x^1+x^3$ | (01010) |
| $\alpha^7$ | $x^2+x^4$ | (00101) |
| $\alpha^8$ | $1+x^2+x^3$ | (10110) |
| $\alpha^9$ | $x^1+x^3+x^4$ | (01011) |
| $\alpha^{10}$ | $1+x^4$ | (10001) |
| $\alpha^{11}$ | $1+x^1+x^2$ | (11100) |
| $\alpha^{12}$ | $x^1+x^2+x^3$ | (01110) |
| $\alpha^{13}$ | $x^2+x^3+x^4$ | (00111) |
| $\alpha^{14}$ | $1+x^2+x^3+x^4$ | (10111) |
| $\alpha^{15}$ | $1+x^1+x^2+x^3+x^4$ | (11111) |
| $\alpha^{16}$ | $1+x^1+x^3+x^4$ | (11011) |
| $\alpha^{17}$ | $1+x^1+x^4$ | (11001) |
| $\alpha^{18}$ | $1+x^1$ | (11000) |
| $\alpha^{19}$ | $x^1+x^2$ | (01100) |
| $\alpha^{20}$ | $x^2+x^3$ | (00110) |
| $\alpha^{21}$ | $x^3+x^4$ | (00011) |
| $\alpha^{22}$ | $1+x^2+x^4$ | (10101) |
| $\alpha^{23}$ | $1+x^1+x^2+x^3$ | (11110) |
| $\alpha^{24}$ | $x^1+x^2+x^3+x^4$ | (01111) |
| $\alpha^{25}$ | $1+x^3+x^4$ | (10011) |
| $\alpha^{26}$ | $1+x^1+x^2+x^4$ | (11101) |
| $\alpha^{27}$ | $1+x^1+x^3$ | (11010) |
| $\alpha^{28}$ | $x^1+x^2+x^4$ | (01101) |
| $\alpha^{29}$ | $1+x^3$ | (10010) |
| $\alpha^{30}$ | $x^1+x^4$ | (01001) |

Fig.11

| $\alpha^j$ | | $(\alpha^j)^{-1}$ | |
|---|---|---|---|
| Power notation | Tuple notation | Power notation | Tuple notation |
| $\alpha^0$ | (10000) | $\alpha^0$ | (10000) |
| $\alpha^1$ | (01000) | $\alpha^{30}$ | (01001) |
| $\alpha^2$ | (00100) | $\alpha^{29}$ | (10010) |
| $\alpha^3$ | (00010) | $\alpha^{28}$ | (01101) |
| $\alpha^4$ | (00001) | $\alpha^{27}$ | (11010) |
| $\alpha^5$ | (10100) | $\alpha^{26}$ | (11101) |
| $\alpha^6$ | (01010) | $\alpha^{25}$ | (10011) |
| $\alpha^7$ | (00101) | $\alpha^{24}$ | (01111) |
| $\alpha^8$ | (10110) | $\alpha^{23}$ | (11110) |
| $\alpha^9$ | (01011) | $\alpha^{22}$ | (10101) |
| $\alpha^{10}$ | (10001) | $\alpha^{21}$ | (00011) |
| $\alpha^{11}$ | (11100) | $\alpha^{20}$ | (00110) |
| $\alpha^{12}$ | (01110) | $\alpha^{19}$ | (01100) |
| $\alpha^{13}$ | (00111) | $\alpha^{18}$ | (11000) |
| $\alpha^{14}$ | (10111) | $\alpha^{17}$ | (11001) |
| $\alpha^{15}$ | (11111) | $\alpha^{16}$ | (11011) |
| $\alpha^{16}$ | (11011) | $\alpha^{15}$ | (11111) |
| $\alpha^{17}$ | (11001) | $\alpha^{14}$ | (10111) |
| $\alpha^{18}$ | (11000) | $\alpha^{13}$ | (00111) |
| $\alpha^{19}$ | (01100) | $\alpha^{12}$ | (01110) |
| $\alpha^{20}$ | (00110) | $\alpha^{11}$ | (11100) |
| $\alpha^{21}$ | (00011) | $\alpha^{10}$ | (10001) |
| $\alpha^{22}$ | (10101) | $\alpha^9$ | (01011) |
| $\alpha^{23}$ | (11110) | $\alpha^8$ | (10110) |
| $\alpha^{24}$ | (01111) | $\alpha^7$ | (00101) |
| $\alpha^{25}$ | (10011) | $\alpha^6$ | (01010) |
| $\alpha^{26}$ | (11101) | $\alpha^5$ | (10100) |
| $\alpha^{27}$ | (11010) | $\alpha^4$ | (00001) |
| $\alpha^{28}$ | (01101) | $\alpha^3$ | (00010) |
| $\alpha^{29}$ | (10010) | $\alpha^2$ | (00100) |
| $\alpha^{30}$ | (01001) | $\alpha^1$ | (01000) |

ERROR CORRECTION

CROSS REFERENCE TO RELATED APPLICATION

This application claims priority to German Patent Application number 10 2015 118 668.3 filed Oct. 30, 2015, which is hereby incorporated by reference in its entirety.

BACKGROUND

It is known, in binary sequences or binary words of a specific length n, to correct arbitrary 1-bit errors, 2-bit errors and 3-bit errors in parallel using BCH codes by means of combinational error correction circuits. This is described for example in US 2015/0039976A1. It is disadvantageous here that not more than 3-bit errors can be corrected.

U.S. Pat. No. 8,291,303 B2 describes a method for correcting 4-bit errors. What is disadvantageous in that case is that solving a fourth-degree equation is reduced in a complicated manner to solving two second-degree equations; as a result, the decoding becomes slow and requires a high outlay on circuitry. Furthermore, it is disadvantageous that no t-bit errors where t>4 can be corrected.

SUMMARY

The disclosure improves the disadvantages mentioned above and, in particular, to afford a possibility for efficiently correcting 4-bit errors or more.

In one embodiment a circuit arrangement is specified for determining a correction signal on the basis of at least one bit error of a binary word
  comprising a plurality of subcircuits (ST), wherein a respective subcircuit is provided for a bit position to be corrected of the binary word,
  wherein each of the subcircuits provides at least two locator polynomial values,
  comprising a selection unit, which determines a correction signal depending on the locator polynomial values and depending on an error signal (err, E).

In one development, a number of T bit positions of the binary word are correctable, wherein the number T is greater than a number of t-bit errors, wherein the t-bit errors are correctable by means of an error code.

The error code can be an error detecting code and/or an error correcting code.

In another development, the number of t-bit errors of correctable bit errors is greater than or equal to four, in particular greater than four.

Moreover, in one development, each subcircuit has at least two internal subcircuits, wherein each internal subcircuit provides a locator polynomial value.

Furthermore, in one development, the at least one bit error is corrected by means of the correction signal.

In one configuration, the at least one bit error is corrected with the aid of a logical combination circuit for logically combining the at least one bit position to be corrected and the correction signal by virtue of the fact that bits respectively to be corrected are logically combined with the corresponding correction values bijectively to form corrected bits.

In another configuration, the correction signal is determined in parallel or substantially in parallel by at least two subcircuits.

Furthermore, in one configuration, the error signal comprises a first component (err), which indicates a number ($\tau$) of erroneous bits, and
  comprises a second component (E), which assumes a first value if an error was detected, and which assumes a second value if no error was detected.

An error is e.g. detected by means of the error code. Furthermore, one option is for the number $\tau$ of erroneous bits to be greater than or equal to 1 and less than or equal to the number of t-bit errors.

Moreover, in one configuration, each of the subcircuits provides at most t−2 locator polynomial values, wherein t indicates the number of bit errors correctable by means of an error code.

In another development, each of the subcircuits provides t/2 locator polynomial values if the number of bit errors is even, and provides (t+1)/2 locator polynomial values if the number of bit errors is odd, wherein t denotes the number of bit errors correctable by means of an error code.

Furthermore, in one development, the error code is a t-bit error correcting BCH code over the Galois field GF ($2^m$) and the locator polynomial values are m-digit binary values and m is greater than or equal to 4.

Moreover, in one development, the error signal comprises a number of the bit errors that occurred, wherein this number is determined with the aid of an error syndrome of the BCH code.

In one configuration, the BCH code is supplemented by at least one parity bit.

In a further configuration, code words of the BCH code comprise:
  data bits, address bits and check bits,
  data bits, bits derived from address bits, and check bits, or
  data bits and check bits.

Furthermore, in one configuration, the selection unit per subcircuit using the locator polynomial values
  determines a first correction signal if no error occurred at the bit position associated with the subcircuit, and
  determines a second correction signal if at least one error occurred at the bit position associated with the subcircuit,
  wherein the correction signal is determined with the aid of the first correction signal and the second correction signal per subcircuit.

In one development, more than four subcircuits, in particular five subcircuits, are provided.

Moreover, in one development, at least one syndrome component is provided for each of the subcircuits.

By way of example, the at least two m-digit locator polynomial values per subcircuit are determined on the basis of the at least one syndrome component provided. In particular, a syndrome can comprise a multiplicity of syndrome components. In this regard, a number of t syndrome components $s_1, s_3, \ldots, s_{2t-1}$ can be provided in accordance with the t-bit errors.

In one configuration, the at least two locator polynomial values are concentrated on one bit by means of a concentrating unit.

By way of example, the concentrating unit is a gate having a multiplicity of inputs and an output. In this regard, it is possible to carry out e.g. an OR logical combination, a NOR logical combination over the entire inputs in order to indicate at the output whether e.g. all the inputs are logic (binary) 0 or 1. Generally, e.g. an m-dimensional signal (that is to say a signal comprising m bits) can be concentrated into a 1-dimensional signal, which can correspondingly be processed further with reduced outlay.

In one development, the concentrating unit comprises at least one gate, in particular an OR gate or a NOR gate.

Furthermore, in one development, the concentrating unit is arranged upstream of the selection unit or downstream of the selection unit.

Moreover, in one development, the selection unit comprises
a multiplexer for selecting one of the locator polynomial values per subcircuit, and
a masking unit for masking the locator polynomial values per subcircuit.

The selection of the multiplexer can be effected for example by means of a part err of the error signal that indicates how many bit errors have occurred. The masking can be effected by means of a part E of the error signal that indicates whether (or not) a bit error has occurred.

In one configuration, the subcircuits and/or the selection unit are/is part of at least one integrated circuit, in particular part of a processing unit.

In another configuration, the error signal is provided by an error detection.

The error detection can comprise a circuit or a program or be realized by means of a circuit and/or a program. The program can be program code in the form of software or firmware.

Furthermore, in one configuration, the circuit arrangement comprises circuit parts which are jointly realized at least in part.

The individual circuit parts, e.g. a plurality of possibly different, similar or identical hardware components, can be jointly implemented. By way of example, circuit parts can be implemented on a common carrier or chip.

In another development, the circuit arrangement is optimizable or was optimized by means of a synthesis tool.

Moreover, in another embodiment the above object, a circuit arrangement is specified for correcting up to t erroneous bits, wherein t is greater than or equal to five, and wherein the circuit arrangement is configured such that correction values for a first and a second bit to be corrected are provided in parallel or substantially in parallel.

In one development, the circuit arrangement is configured such that correction values for T bit positions are provided in parallel or substantially in parallel, wherein T is greater than t.

In an additional development, a t-bit error correcting code is used for correcting the t erroneous bits.

Furthermore, in one configuration, the t-bit error correcting code is a BCH code.

In yet another embodiment, a method for determining a correction signal on the basis of at least one bit error of a binary word is proposed, comprising the following steps:
determining at least two locator polynomial values by means of a subcircuit for a bit position to be corrected of the binary word,
determining a correction signal depending on the locator polynomial values and depending on an error signal (err, E).

In one development, the correction signal is determined in parallel or substantially in parallel by at least two subcircuits.

The above-described properties, features and advantages of this disclosure and the way in which they are achieved will be described below in association with a schematic description of exemplary embodiments which are explained in greater detail in association with the drawings. In this case, identical or identically acting elements may be provided with identical reference signs, for the sake of clarity.

BRIEF DESCRIPTION OF THE DRAWINGS

In the figures:
FIG. 10 shows a table illustrating different forms of notation of elements of a Galois field $GF(2^m)$ where m=5.
FIG. 11 shows a table for an inverter in the Galois field $GF(2^5)$.

DETAILED DESCRIPTION

Figure 1:
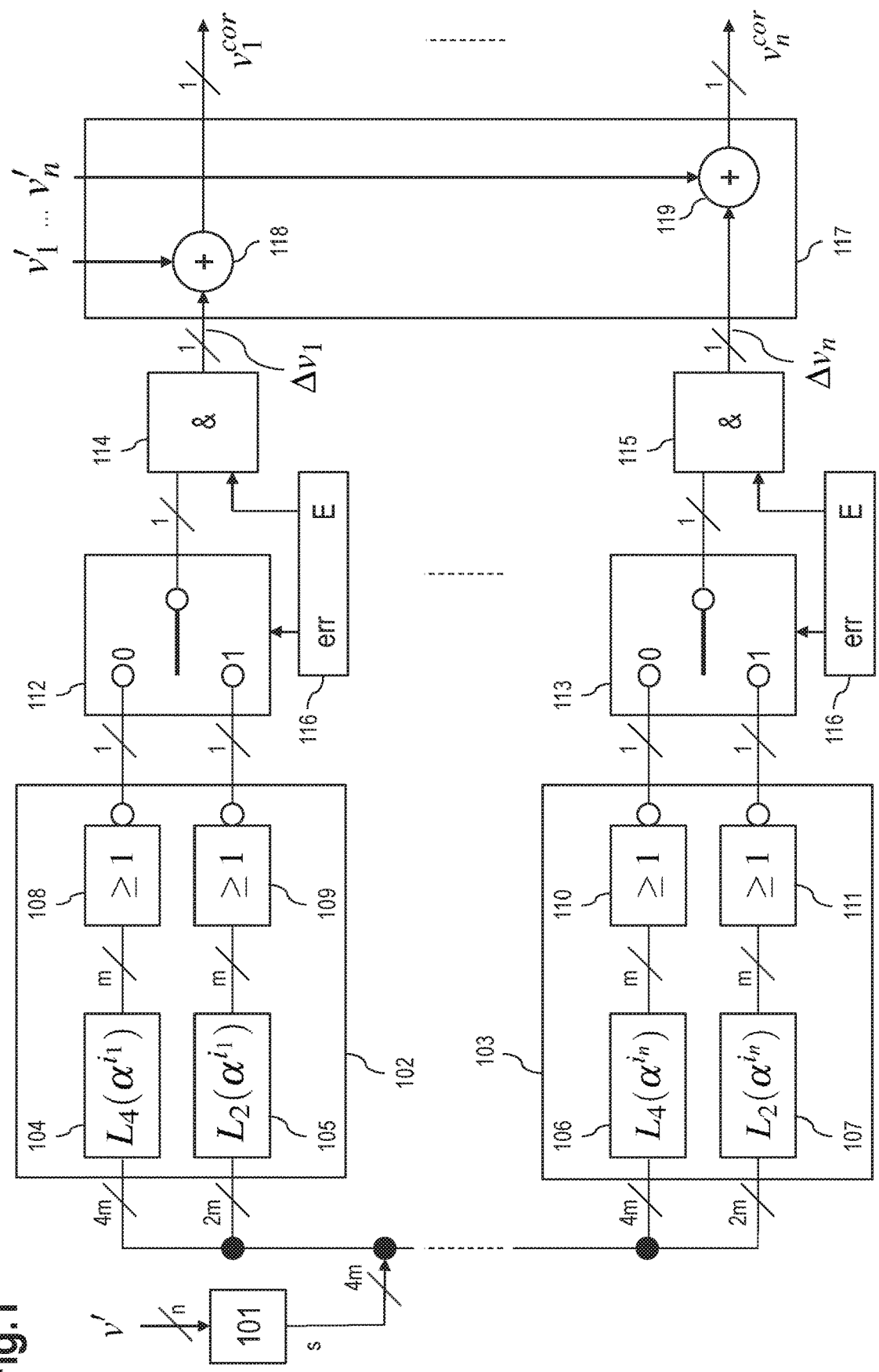
FIG. 1 shows one exemplary embodiment of a circuit arrangement using a 4-bit error correcting BCH code.

BCH codes can be used for the error correction of randomly distributed multi-bit errors. This is described for example in [Lin, S., Costello, D.: "Error Control Coding", Prentice Hall, 1983, cf. e.g. pages 143 to 160].

A BCH code is a linear code which can be described by a parity check matrix H and a generator matrix G. The generator matrix G can be derived for example from the parity check matrix.

If the code has the length N and if it has k information bits, the parity check matrix H is an (M,N) matrix having M rows and N columns, wherein M=N−k. The generator matrix G is then a (k,N) matrix having k rows and N columns, and the code has M check bits.

A t-bit error correcting unshortened BCH code can be described by an H matrix $$H = \begin{pmatrix} H_1 \\ H_2 \\ \vdots \\ H_{2t-1} \end{pmatrix} = (h_1, \ldots, h_N)$$

wherein the H matrix is represented in separated form. Components $H_1, H_3, \ldots,$ and $H_{2t-1}$ of the H matrix are usually chosen as $$H_1 = (\alpha^0, \alpha^1, \ldots, \alpha^i, \ldots, \alpha^{N-1}) = (h_1^1, \ldots, h_i^1, \ldots, h_N^1),$$

$$H_3 = (\alpha^0, \alpha^3, \ldots, \alpha^{3i}, \ldots, \alpha^{3(N-1)}) = (h_1^3, \ldots, h_i^3, \ldots, h_N^3),$$

-continued $$H_{2t-1} = (\alpha^0, \alpha^{2t-1}, \ldots, \alpha^{(2t-1)i}, \ldots, \alpha^{(2t-1)\cdot(N-1)}) =$$
$$(h_1^{2t-1}, \ldots, h_i^{2t-1}, \ldots, h_N^{2t-1}),$$

if the code is not shortened.

In this case, $\alpha$ may be a primitive element of a finite body $GF(2^m)$, called Galois field. In this case it holds true that: $N=2^m-1$.

The exponents of $\alpha^j$, of $\alpha^{3j}$, ..., and of $\alpha^{(2t-1)j}$ are determined modulo $2^m-1$. If $\alpha$ is a primitive element of the Galois field used, the corresponding BCH code can be designated as primitive BCH code.

$H_1$, $H_3$, ..., $H_{2t-1}$ are generally in each case (m,N) matrices having
m rows and
$N=2^m-1$ columns.

In specific applications it may happen that some of the m rows of one of the matrices $H_i$ are linearly dependent. In this case, rows of the matrix $H_i$ can be omitted until all the rows thereof are linearly independent. The number of rows of the matrix $H_i$ can then be less than m.

The elements $\alpha^i$ of the Galois field $GF(2^m)$ in their vector notation are for example m-digit binary column vectors.

If L columns of the H matrix of the unshortened BCH code are deleted, this results in an H matrix of a shortened BCH code of the length n=N−L. For a shortened code it then holds true that $n=N-L<2^m-1$.

It is possible to supplement the H matrix with a row of all ones. An additional row of ones in the H matrix corresponds to additionally taking account of a total parity. Taking account of the total parity, the H matrix can have the form $$H = \begin{pmatrix} H_1 \\ H_3 \\ \vdots \\ H_{2t-1} \\ P \end{pmatrix}$$

wherein P represents the row of ones.

A shortened BCH code of length n will now be considered by way of example, wherein $n=N-L<2^m-1$ holds true. A code word $v=v_1, \ldots, v_n$ of this code, which can also be designated as code vector, consists of n components $v_1, v_2, \ldots, v_n$. In this case, a code vector can be a row vector or a column vector.

If a matrix is multiplied by a vector from the right, the vector is to be interpreted as a column vector and the result is a column vector. If a matrix is multiplied by a vector from the left, the vector is a row vector and the result of the multiplication is a row vector. It is not necessary to emphasize the corresponding vectors explicitly as column vectors or row vectors since it is clear from the respective context whether a column vector or a row vector is involved. If particular emphasis is intended to be given to the fact that a vector w is a column vector, the notation $w^T$ is used.

If a code word $v=v_1, \ldots, v_n$ is disturbed into a word $v'=v'_1, \ldots, v'_n$, the difference between the code word v and the disturbed code word v' can be described by an error vector e where $$e=e_1, \ldots, e_n=v_1 \oplus v'_1, \ldots, v_n \oplus v'_n=v \oplus v'.$$

A component $e_i$ of the error vector e is equal to 1 if a component of the code word $v_i$ and a component of the disturbed code word $v'_i$ differ and $v_i=v'_i \oplus 1=\overline{v'_i}$ holds true. A component $e_j$ of the error vector e is equal to 0 if a component of the code word $v_j$ and a component of the disturbed code word $v'_j$ are identical and $v_j=v'_j$ holds true.

If it is possible for an error to be corrected by an error correction circuit, the correction values output by the error correction circuit can be identical to the components of the error vector. In this case, the correction circuit outputs the correction value $e_i$ at an i-th output of its n outputs. The correction value $e_i$ can then be exclusive-ORed (XORed) with the component $v'_i$ to be corrected to give $$v^{cor}=v'_i \oplus e_i$$

The correction values $e_i$ can be combined to form a correction vector. The correction vector is identical to the error vector if the error can be corrected by the code and the components of the correction vector and of the vector to be corrected are XORed component by component.

If an error can be corrected by an error correction circuit, the correction values output by the error correction circuit may be identical to the inverted components of the error vector. In this case, the correction circuit provides the inverted correction value $\overline{e}_i$ at its i-th output of its n outputs. The inverted correction value $\overline{e}_i$ can be correspondingly logically combined with the component $v'_i$ to be corrected to give $$v^{cor}=\overline{v'_i \oplus \overline{e}_j}.$$

It is also possible to invert a subset of the correction values.

It is not necessary for all n bits of a possibly erroneous n-digit binary word $v=v'_1, \ldots, v'_n$ to be corrected. It is possible, for example, to correct T bits of said n bits, wherein T≤n holds true. If the correction is effected using a t-bit error correcting code, it holds true that T>t, for example. It is possible to correct e.g. only the data bits of the binary word v using the t-bit error correcting code. It is also possible for T=n to hold true and for all the bits to be corrected.

In the exemplary embodiments described here, cases for which t<T≤n holds true are described, in particular.

If the vector v is a code vector of a separable code in which the data bits and the check bits are separated in the code vector v, it is possible to correct only the data bits or only a portion of the data bits of the vector v'. Correspondingly, it is an option to correct combinations of data bits and check bits.

An error syndrome $s=(s_1, s_3, \ldots, s_{2t-1}, s_P)$ of a binary word v' is determined by $$s=H \cdot v' \quad (1)$$

wherein for the components $s_i$ of the error syndrome s it holds true that:

$$s_1 = H_1 \cdot v', \quad (2)$$

$$s_3 = H_3 \cdot v', \quad (3)$$

i. :

$$s_{2t-1} = H_{2t-1} \cdot v', \quad (4)$$

$$s_P = P \cdot v' = (1, \ldots, 1) \cdot v' = v'_1 \oplus v'_2 \oplus \ldots \oplus v'_n. \quad (5)$$

The error syndrome of an (undisturbed) code word v is equal to 0, hence it holds true that:

$$S=H \cdot v=0. \quad (6)$$

Correspondingly, for a disturbed code word v'=v⊕e (that is to say a binary word which is not a code word (also designated as "non-code word")) it holds true that:

$$s = H \cdot v' = H \cdot (v \oplus e) = H \cdot v \oplus H \cdot e = H \cdot e \neq 0. \tag{7}$$

The error syndrome s is determined by the error vector e.

In order to determine the associated correct code word from the erroneous non-code word v', those components $v'_j$ of the disturbed code word should be inverted for which the associated component $e_j$ of the error vector e reads:

$e_j = 1$.

The component $e_j$ thus corresponds to the correction value which can be used by the error correction circuit.

For the shortened BCH code considered, the error vector e can be determined from the error syndrome $s = s_1, s_3, \ldots, s_{2t-1}, s_P$ with the H matrix $$H = \begin{pmatrix} H_1 \\ H_3 \\ \vdots \\ H_{2t-1} \\ P \end{pmatrix}$$

The matrices $H_1, H_3, \ldots, H_{2t-1}$ can be described by their columns as follows:

$$H_1 = (h_1^1, h_2^1, \ldots, h_n^1) = (\alpha^{i_1}, \alpha^{i_2}, \ldots, \alpha^{i_n}), \tag{8}$$

$$H_3 = (h_1^3, h_2^3, \ldots, h_n^3) = (\alpha^{3(i_1)}, \alpha^{3(i_2)}, \ldots, \alpha^{3(i_n)}), \tag{9}$$

$$\vdots$$

$$H_{2t-1} = \tag{10}$$
$$(h_1^{2t-1}, h_2^{2t-1}, h_n^{2t-1}) = (\alpha^{(2t-1)(i_1)}, \alpha^{(2t-1)(i_2)}, \ldots, \alpha^{(2t-1)(i_n)})$$

and $$i. \quad P = \frac{(1, 1, \ldots, 1)}{n}. \tag{11}$$

The exponents of α, as mentioned above, are determined modulo $2^m - 1$, and the exponents $i_1, i_2, \ldots, i_n$ are pairwise distinct. In this case, it is not necessary that $i_j = j$ for $j = 1, \ldots, n$.

If a 1-bit error is then present in the j-th bit, it holds true that:

$$ii. \quad s_1 = \alpha^{ij}, \tag{12}$$

$$iii. \quad s_3 = \alpha^{3(ij)}, \tag{13}$$

$$\vdots$$

$$b. \quad s_{2t-1} = \alpha^{(2t-1)(ij)}, \tag{14}$$

$$i. \quad s_P = 1 \tag{15}$$

and $s_1^3 = s_3, s_1^5 = s_5, \ldots, s_{2t-1} = s_1^{2t-1}$.

If a 2-bit error is present in the bit positions j and l, it holds true that:

$$ii. \quad s_1 = \alpha^{ij} \oplus \alpha^{il} \tag{16}$$

$$iii. \quad s_3 = \alpha^{3(ij)} \oplus \alpha^{3(il)}, \tag{17}$$

$$\vdots$$

$$c. \quad s_{2t-1} = \alpha^{(2t-1)(ij)} \oplus \alpha^{(2t-1)(il)}, \tag{18}$$

$$i. \quad s_P = 0 \tag{19}$$

and $s_1^3 \neq s_3$.

If a 3-bit error is present in the bit positions j, l and k, it holds true that:

$$2. \quad s_1 = \alpha^{ij} \oplus \alpha^{il} \oplus \alpha^{ik}, \tag{20}$$

$$3. \quad s_3 = \alpha^{3(ij)} \oplus \alpha^{3(il)} \oplus \alpha^{3(ik)}, \tag{21}$$

$$\vdots$$

$$ii. \quad s_{2t-1} = \alpha^{(2t-1)(ij)} \oplus \alpha^{(2t-1)(il)} \oplus \alpha^{(2t-1)(ik)}, \tag{22}$$

$$1. \quad s_P = 1 \tag{23}$$

and $s_1^3 \neq s_3$.

If a 4-bit error is present in the bit positions j, k, l and q, it holds true that:

$$2. \quad s_1 = \alpha^{ij} \oplus \alpha^{il} \oplus \alpha^{iq} \tag{24}$$

$$3. \quad s_3 = \alpha^{3(ij)} \oplus \alpha^{3(il)} \oplus \alpha^{3(ik)} \oplus \alpha^{3(iq)}, \tag{25}$$

$$a. \quad \vdots$$

$$iii. \quad s_{2t-1} = \alpha^{(2t-1)(ij)} \oplus \alpha^{(2t-1)(il)} \oplus \alpha^{(2t-1)(ik)} \oplus \alpha^{(2t-1)(iq)} \tag{26}$$

$$1. \quad s_P = 0 \tag{27}$$

It is then possible to determine the location of an error as a zero of a locator polynomial. If a μ-bit error is present, the error locations can be determined by the μ zeroes of a locator polynomial of μ-th degree $L_\mu(x)$ where $$L_\mu(x) = x^\mu + \sigma_1^\mu x^{\mu-1} + \sigma_2^\mu x^{\mu-2} + \ldots + \sigma_{\mu-1}^\mu x^1 + \sigma_\mu^\mu \tag{28}$$

It is possible to determine the μ−1 error locations on a μ−1-bit error by means of the zeroes of the locator polynomial of μ-th degree. In the case of a μ−1-bit error, a first zero of the locator polynomial of μ-th degree is equal to 0, while the further μ−1 zeroes correspond to the μ−1 error locations.

It is known to determine the locator polynomial corresponding to the number of errors iteratively according to the Berlekamp-Massey algorithm (see e.g. [Lin, S., Costello, D.: "Error Control Coding", Prentice Hall, 1983, cf. e.g. pages 155 to 160]). It is disadvantageous here that a corresponding algorithm is implementable only with high outlay in terms of hardware.

Furthermore, the coefficients of the corresponding locator polynomials can be determined by solving a linear equation from the syndrome components. This is explained below.

Firstly, by way of example, locator polynomials are specified for μ=1, 2, 3, 4, 5.

For μ=1 the locator polynomial has the form $$L_1(x) = x + \sigma_1^1,$$

for μ=2 the locator polynomial has the form $$L_2(x)=x^2+\sigma_1^2 x+\sigma_2^2,$$

for μ=3 the locator polynomial has the form $$L_3(x)=x^3+\sigma_1^3 x^2+\sigma_2^3 x^1+\sigma_3^3,$$

for μ=4 the locator polynomial has the form $$L_4(x)=x^4+\sigma_1^4 x^3+\sigma_2^4 x^2+\sigma_3^4 x^1+\sigma_4^4$$

and for μ=5 the locator polynomial has the form $$L_5(x)=x^5+\sigma_1^5 x^4+\sigma_2^5 x^3+\sigma_3^5 x^2+\sigma_4^5 x^1+\sigma_5^5.$$

If a μ-bit error is present, the μ error locations $i_1$, $i_2$, $i_3$, ... $i_\mu$ are the exponents of the zeroes $\alpha^{i_1}, \alpha^{i_2}, \ldots, \alpha^{i_\mu}$ of the locator polynomial $L_\mu(x)$.

If, in the locator polynomial $L_\mu(x)$, the variable x is replaced by $y^{-1}=1/y$ and if $$1.\ L_\mu^*(y)=y^\mu \cdot L_\mu(y^{-1}) \qquad (29)$$

is furthermore set, then it holds true that $$L_\mu^*(y)=1+\sigma_1^\mu x^1+\sigma_2^\mu x^2+\ldots+\sigma_{\mu-1}^\mu x^{\mu-1}+\sigma_\mu^\mu x^\mu. \qquad (30)$$

The polynomial $L_\mu^*(y)$ can likewise be used as locator polynomial. The μ error locations $j_1, j_2, j_3, \ldots j_\mu$ are then the negative exponents of the zeroes $\alpha^{j_1}, \alpha^{j_2}, \ldots, \alpha^{j_\mu}$ of the locator polynomial $L_\mu^*(y)$, wherein the exponents are considered in each case modulo $2^m-1$ if the Galois field used is $GF(2^m)$.

The locator polynomial $L_\mu(x)$ is used by way of example below.

The coefficients of the locator polynomials can be determined as solutions of the following linear equation systems.

For μ=2 it holds true that $$M(2)\cdot\begin{pmatrix}\sigma_1^2\\\sigma_2^2\end{pmatrix}=\begin{pmatrix}1 & 0\\s_2 & s_1\end{pmatrix}\cdot\begin{pmatrix}\sigma_1^2\\\sigma_2^2\end{pmatrix}=\begin{pmatrix}s_1\\s_3\end{pmatrix} \qquad (31)$$

with the solution $$\sigma_1^2 = s_1 \text{ and } \sigma_2^2 = \frac{s_3+s_1^3}{s_1}.$$

This takes account of the fact that in the Galois field $GF(2^m)$ it holds true that: $s_2=s_1^2$.

For μ=3 it holds true that $$M(3)\cdot\begin{pmatrix}\sigma_1^3\\\sigma_2^3\\\sigma_3^3\end{pmatrix}=\begin{pmatrix}1 & 0 & 0\\s_2 & s_1 & 1\\s_4 & s_3 & s_2\end{pmatrix}\cdot\begin{pmatrix}\sigma_1^3\\\sigma_2^3\\\sigma_3^3\end{pmatrix}=\begin{pmatrix}s_1\\s_3\\s_5\end{pmatrix} \qquad (32)$$

wherein $\sigma_1^3$, $\sigma_2^3$, $\sigma_3^3$ are determined by solving the linear equation to give $$i.\ \sigma_1^3 = s_1, \qquad (33)$$

$$ii.\ \sigma_2^3 = \frac{s_1^2 s_3 + s_5}{\sigma_1^3 + s_3},$$

$$iii.\ \sigma_3^3 = s_1^3 + s_3 + s_1 \cdot \frac{s_1^2 s_3 + s_5}{\sigma_1^3 + s_3}$$

wherein this solution takes account of the fact that in the Galois field $GF(2^m)$ it holds true that: $s_2=s_1^2; s_4=s_2^2=s_1^4$.

For μ=4 it holds true that $$M(4)\cdot\begin{pmatrix}\sigma_1^4\\\sigma_2^4\\\sigma_3^4\\\sigma_4^4\end{pmatrix}=\begin{pmatrix}1 & 0 & 0 & 0\\s_2 & s_1 & 1 & 0\\s_4 & s_3 & s_2 & s_1\\s_6 & s_5 & s_4 & s_3\end{pmatrix}\cdot\begin{pmatrix}\sigma_1^4\\\sigma_2^4\\\sigma_3^4\\\sigma_4^4\end{pmatrix}=\begin{pmatrix}s_1\\s_3\\s_5\\s_7\end{pmatrix}, \qquad (34)$$

wherein $\sigma_1^4$, $\sigma_2^4$, $\sigma_3^4$, $\sigma_4^4$ are determined by solving the linear equation to give $$i.\ \sigma_1^4 = s_1, \qquad (35)$$

$$ii.\ \sigma_2^4 = \frac{s_1 s_7 + s_3 s_5 + s_1^5(s_3+s_1^3)}{s_1 s_5 + s_3^2 + s_1^3 s_3 + s_1^6},$$

$$iii.\ \sigma_3^4 = \frac{s_1^2 s_7 + s_1^4 s_5 + s_3(s_3+s_1^3)^2}{s_1 s_5 + s_3^2 + s_1^3 s_3 + s_1^6},$$

$$iv.\ \sigma_4^4 = \frac{(s_7 + s_1^2 s_5 + s_1 s_3^2 + s_1^4 s_3)(s_3+s_1^3) + (s_5+s_1^5)^2}{s_1 s_5 + s_3^2 + s_1^3 s_3 + s_1^6}$$

wherein this solution takes account of the fact that in the Galois field $GF(2^m)$ it holds true that: $s_2=s_1^2; s_4=s_2^2=s_1^4$; $s_6=s_3^2$.

For μ=5 it holds true that $$M(5)\cdot\begin{pmatrix}\sigma_1^5\\\sigma_2^5\\\sigma_3^5\\\sigma_4^5\\\sigma_5^5\end{pmatrix}=\begin{pmatrix}1 & 0 & 0 & 0 & 0\\s_2 & s_1 & 1 & 0 & 0\\s_4 & s_3 & s_2 & s_1 & 1\\s_6 & s_5 & s_4 & s_3 & s_2\\s_8 & s_7 & s_6 & s_5 & s_4\end{pmatrix}\cdot\begin{pmatrix}\sigma_1^5\\\sigma_2^5\\\sigma_3^5\\\sigma_4^5\\\sigma_5^5\end{pmatrix}=\begin{pmatrix}s_1\\s_3\\s_5\\s_7\\s_9\end{pmatrix}, \qquad (36)$$

wherein the concrete values for $\sigma_1^5, \ldots, \sigma_5^5$ are determined by solving the linear equation (36) and are specified for example in [Wicker, S.: "Error Control Systems for digital Communication and Storage", Prentice Hall, 1995, page 208].

Generally, a matrix M(t) is determined to give $$M(t) = \begin{pmatrix} 1 & 0 & 0 & 0 & 0 & \cdots & 0\\ s_2 & s_1 & 1 & 0 & 0 & \cdots & 0\\ s_4 & s_3 & s_2 & s_1 & 1 & \cdots & 0\\ \vdots & \vdots & \vdots & \vdots & \vdots & \cdots & \vdots\\ s_{2t-2} & s_{2t-3} & s_{2t-4} & s_{2t-5} & s_{2t-6} & \cdots & s_{t-1}\end{pmatrix}$$

and for more than five bit errors (t>5) it holds true that:

$$M(t) \cdot \begin{pmatrix} \sigma_1^t \\ \sigma_2^t \\ \sigma_3^t \\ \vdots \\ \sigma_t^t \end{pmatrix} = \qquad (37)$$

$$\begin{pmatrix} 1 & 0 & 0 & 0 & 0 & \cdots & 0 \\ s_2 & s_1 & 1 & 0 & 0 & \cdots & 0 \\ s_4 & s_3 & s_2 & s_1 & 1 & \cdots & 0 \\ \vdots & \vdots & \vdots & \vdots & \vdots & \cdots & \vdots \\ s_{2t-2} & s_{2t-3} & s_{2t-4} & s_{2t-5} & s_{2t-6} & \cdots & s_{t-1} \end{pmatrix} \cdot \begin{pmatrix} \sigma_1^t \\ \sigma_2^t \\ \sigma_3^t \\ \vdots \\ \sigma_t^t \end{pmatrix} = \begin{pmatrix} s_1 \\ s_3 \\ s_5 \\ \vdots \\ s_{2t-1} \end{pmatrix}.$$

The values for $\sigma_1^t, \ldots, \sigma_t^t$ are again determined by solving a linear equation, hereby solving the linear equation (37). This takes account of the fact that in the Galois field $GF(2^m)$ it holds true that: $s_{2l}=s_l^2$ for $l=1, 2, 3, \ldots$.

One objective of an error correction circuit is to efficiently determine the error positions of an arbitrary 1-bit error, an arbitrary 2-bit error or an arbitrary 3-bit error, ..., or an arbitrary r-bit error where $1 \leq r \leq t$ from the error syndrome, i.e. from the syndrome components $s_1, s_3, \ldots, s_{2t-1}$ of the BCH code, and in the determined bit positions of the data word, by means of a correction value, to carry out a correction of the at least one bit detected as erroneous.

If it is assumed that as a maximum a t-bit error is present, a conclusion can be drawn from $$Det(M(t)) \neq 0$$

that either a t-bit error or a (t−1)-bit error is present. If a t-bit error is present, the error locations are determined by the t zeroes of the locator polynomial of $L_t(x)$ t-th degree. If a t−1-bit error is present, then once again t zeroes of the locator polynomial $L_t(x)$ are present, t−1 of these zeroes determine the error locations and the remaining (one) zero is 0 and does not determine an error location.

If it holds true that $$Det(M(t))=0$$

neither a t-bit error nor a (t−1)-bit error is present. In this case, at most a t−2-bit error can be present. If $$Det(M(t-2)) \neq 0$$

a conclusion can be drawn that either a (t−2)-bit error or a (t−3)-bit error is present:
  If a t−2-bit error is present, the t−2 error locations are determined by the t−2 zeroes of the locator polynomial $L_{t-2}(x)$ having the degree t−2.
  If a t−3-bit error is present, the t−3 error locations are determined by the t−3 zeroes≠0 of the locator polynomial $L_{t-2}(x)$ having the degree t−2. A further zero of the locator polynomial of t−2-th order is 0 in this case.
If $$Det(M(t-2))=0$$

a conclusion can be drawn that as a maximum a (t−4)-bit error is present.

In order to determine the number of errors, the determinants $$Det(M(t)), Det(M(t-2)), Det(M(t-4)), \ldots$$

can be considered until a determined ≠0 is found.

For a 4-bit error correcting BCH code and for a 4-bit error correcting BCH code with additional total parity, the procedure shall be explained below:

Firstly, a 4-bit error correcting code is considered without taking account of the total parity. The determinant Det(M(4)) of the matrix M(4) is determined. Furthermore, $s=(s_1, s_3, s_5, s_7) \neq 0$ is assumed.

The determinant Det(M(4)) is expanded with respect to the elements of the first row and the determinant of the remaining 3×3 matrix is calculated directly. With $s_2 = s_1^2$ and $s_4 = s_1^4$ it follows that:

$$Det(M(4)) = Det\begin{pmatrix} 1 & 0 & 0 & 0 \\ s_2 & s_1 & 1 & 0 \\ s_4 & s_3 & s_2 & s_1 \\ s_6 & s_5 & s_4 & s_3 \end{pmatrix} = \qquad (38)$$

$$Det\begin{pmatrix} s_1 & 1 & 0 \\ s_3 & s_2 & s_1 \\ s_5 & s_4 & s_3 \end{pmatrix} = s_1 s_2 s_3 + s_1 s_5 + s_1^2 s_4 + s_3^2 = s_1^3 s_3 + s_1 s_5 + s_1^6 s_3^2.$$

The algebraic expression thus obtained can be implemented from the values of the syndrome components using known Galois field multipliers and can be optimized with the aid of a synthesis tool.

If Det(M(4))≠0 holds true, a 4-bit error or a 3-bit error is present.

If Det(M(4))=0 holds true, a 2-bit error or a 1-bit error is present.

Consideration is subsequently given to a 4-bit error correcting code with account being taken of the total parity P. $s=(s_1, s_3, s_5, s_7, P) \neq 0$ is assumed. The determinants are expanded in each case with respect to the elements of the first row and the determinants of the 3×3 matrices are calculated directly. With $s_2=s_1^2$, $s_4=s_1^4$, $s_6=s_3^2$ and $s_8=s_1^8$ it follows that:

i.

$$Det(M(5)) = Det\begin{pmatrix} 1 & 0 & 0 & 0 & 0 \\ s_2 & s_1 & 1 & 0 & 0 \\ s_4 & s_3 & s_2 & s_1 & 1 \\ s_6 & s_5 & s_4 & s_3 & s_2 \\ s_8 & s_7 & s_6 & s_5 & s_4 \end{pmatrix} = Det\begin{pmatrix} s_1 & 0 & 0 & 0 \\ s_3 & s_2 & s_1 & 0 \\ s_5 & s_4 & s_3 & s_2 \\ s_7 & s_6 & s_5 & s_4 \end{pmatrix} = \qquad (39)$$

$$s_3^2 s_4 + s_1 s_2 s_7 + s_5^2 + s_1 s_4 s_5 + s_2 s_3 s_5 + s_3 s_7.$$

The algebraic expression obtained can be implemented from the values of the syndrome components using known Galois field multipliers and can be optimized with the aid of a synthesis tool.

If Det(M(5))≠0 holds true, a 5-bit error or a 4-bit error is present. If the parity P=1, a 5-bit error is involved; if the parity P=0, a 4-bit error is involved.

If Det(M(5))=0 holds true, a 3-bit error, a 2-bit error or a 1-bit error is present if $s=(s_1, s_3, s_5, s_7) \neq 0$. If the parity P=0, a 2-bit error is present; if the parity P=1, either a 1-bit error or a 3-bit error is present.

It is possible to determine the determinant Det(M(3)). If Det(M(3))=1 holds true, a 3-bit error is present; if Det(M(3))=0, a 1-bit error is present.

In order to distinguish between a 1-bit error and a 3-bit error, it is also possible to check whether $s_1^3=s_3$ or whether $s_1^3 \neq s_3$ holds true: if $s_1^3=s_3$, a 1-bit error is present; if $s_1^3 \neq s_3$, a 3-bit error is present.

By way of example, an error signal comprises two components E and err. If an error is present and if $s \neq 0$, the component E of the error signal is equal to 1. If no error is present and if s=0, the component E of the error signal is equal to 0.

The number of errors that occurred can be indicated by the component err of the error signal, which assumes for example a corresponding binary coded value 1, 2, . . . , t in the case of a 1-bit error, a 2-bit error, . . . , a t-bit error.

FIG. 1 shows an exemplary circuit arrangement for correcting a possibly erroneous binary word $v'=v'_1, \ldots, v'_n$ using a 4-bit error correcting BCH code over a Galois field $GF(2^m)$. The 4-bit error correcting BCH code allows a correction of 1-bit errors, 2-bit errors, 3-bit errors or 4-bit errors.

FIG. 1 comprises a syndrome generator 101, to which the possibly erroneous binary word v' is provided. Furthermore, FIG. 1 comprises n subcircuits $ST_j$, of which two subcircuits 102 and 103 for j=1 and j=n are illustrated by way of example.

The subcircuit 102 corresponds to a first subcircuit $ST_1$ and the subcircuit 103 shows an n-th subcircuit $ST_n$. Thus there are n subcircuits $ST_j$ where j=1, . . . , n for forming output values of the subcircuit $ST_j$. Each of the subcircuits $ST_j$ is provided for a bit position to be corrected of the binary word v'.

The subcircuit 102 comprises two internal subcircuits 104, 105 and the subcircuit 103 comprises two internal subcircuits 106, 107. Generally, in FIG. 1 the j-th subcircuit $ST_j$ comprises two internal subcircuits, for example.

Each of the internal subcircuits provides a locator polynomial value. The internal subcircuit 104 provides the locator polynomial value according to $L_4(\alpha^{ij})$ where j=1, the internal subcircuit 105 provides the locator polynomial value according to $L_2(\alpha^{ij})$ where j=1, the internal subcircuit 106 provides the locator polynomial value according to $L_4(\alpha^{ij})$ where j=n, and the internal subcircuit 107 provides the locator polynomial value according to $L_2(\alpha^{ij})$ where j=n.

The subcircuits 102 and 103 in each case also have a NOR gate (NOT-OR gate) 108 to 111 per internal subcircuit 104 to 107. Each of the NOR gates 108 to 111 has m inputs and an output. The output is logic 1 whenever all m inputs of the NOR gate are logic 0.

By way of example, the subcircuit 102 is explained in greater detail below. The explanations correspondingly hold true for the subcircuit 103, and also generally for any other subcircuit $ST_j$.

The subcircuit 102 has 4·m inputs for inputting syndrome components $s_1, s_3, s_5, s_7$ provided by the syndrome generator 101. In this case, the syndrome components $s_1, s_3, s_5, s_7$ are applied to the 4·m-bit-wide input of the internal subcircuit 104 and the syndrome components $s_1, s_3$ are applied to the 2·m-bit-wide input of the internal subcircuit 105.

The internal subcircuit 104 has an m-bit-wide output connected to the input of the NOR gate 108. The output of the NOR gate 108 is connected to the first input (0 input) of a selection unit 112.

The internal subcircuit 105 has an m-bit-wide output connected to the input of the NOR gate 109. The output of the NOR gate 109 is connected to the second input (1 input) of the selection unit 112.

The subcircuit 103 is constructed correspondingly. Furthermore, overall n subcircuits $ST_j$ are provided, one per bit position j. FIG. 1 shows by way of example the subcircuit 102 for the bit position j=1 and the subcircuit 103 for the bit position j=n. The remaining n−2 subcircuits $ST_2, ST_3, ST_{n-1}$ are indicated by the dots between the subcircuits 102 and 103 in FIG. 1.

If a bit position j of the binary word v' is erroneous and overall a 4-bit error or a 3-bit error is present at different bit positions, at the m outputs of the internal subcircuit which determines the locator polynomial value according to $L_4(\alpha^{ij})$ there is provided an m-digit locator polynomial value $$\underbrace{0, \ldots, 0}_{m}$$

(this locator polynomial value is also abbreviated to $\{0\}_m$.

If the bit position j is not erroneous and overall a 4-bit error or a 3-bit error is present at bit positions different than j, the internal subcircuit which determines the locator polynomial value according to $L_4(\alpha^{ij})$ provides a value different than the first locator polynomial value, that is to say a value that is not equal to $\{0\}_m$.

If the bit position j is erroneous and a 2-bit error or a 1-bit error is present at different bit positions, the internal subcircuit which determines the locator polynomial value according to $L_2(\alpha^{ij})$ provides the m-digit locator polynomial value $\{0\}_m$.

If the bit position j is not erroneous and a 2-bit error or a 1-bit error is present at different bit positions, the internal subcircuit which determines the locator polynomial value according to $L_2(\alpha^{ij})$ provides a value different than the locator polynomial value $\{0\}_m$.

As has already been explained, each of the NOR gates 108 to 111 supplies a value 1 in each case at its output if the m bits at its input have the value 0, that is to say if the locator polynomial value $\{0\}_m$ is present. Otherwise the value 0 is present at the output of the respective NOR gate 108 to 111.

The selection unit 112 can also be regarded as a multiplexer. Depending on the component err of the error signal, the selection unit 112 is driven such that either its first input or its second input is connected to its output. With regard to the subcircuit 102, this means that either the output of the NOR gate 108 or the output of the NOR gate 109 is connected to the output of the selection unit 112.

The output of the selection unit 112 is connected to the first input of an AND gate 114. The second component E of the error signal is present at the second input of the AND gate 114. The output of the AND gate 114 is connected to a logical combination circuit 117.

The two components err, E of the error signal are provided by an error detecting unit 116.

It is possible for the same error detecting unit 116 to be used for different outputs, and thus for the error detecting unit 116 to be required only once.

The component E of the error signal is E=0 if the error syndrome provided by the syndrome generator 101 is equal to $\{0\}_l$ and if no error is present. The component E of the error signal is E=1 if the error syndrome is not equal to $\{0\}_l$ and an error is present. In this case, $\{0\}_l$ denotes a 0 vector having l components, wherein here l=4m.

The component err of the error signal supplies the information as to what number of bits are erroneous.

The correction signal $\Delta v_1$ is formed at the output of the AND gate 114. The output of the AND gate 114 is connected to the first input of an XOR gate 118, at the second input of which the bit $v'_1$ to be corrected is present. A corrected value $$v_1^{cor} = v'_1 + \Delta v_1$$

is provided at the output of the XOR gate 118. In this case, the operation "+" denotes the addition modulo 2 that is realized by the XOR gate 118.

These explanations correspondingly hold true for the logical combinations of the other subcircuits $ST_2, \ldots, ST_n$.

By way of example, the following holds true for the subcircuit 103, which is also designated as subcircuit $ST_n$:

The first output of the subcircuit 103 (1-bit output of the NOR gate 110) is connected to the first input (0 input) of a selection unit 113. The second output of the subcircuit 103 (1-bit output of the NOR gate 111) is connected to the second input (1 input) of the selection unit 113. Depending on the component err of the error signal, the selection unit 113 is driven such that either its first input or its second input is connected to its output. With regard to the subcircuit 103, this means that either the output of the NOR gate 110 or the output of the NOR gate 111 is connected to the output of the selection unit 113.

The output of the selection unit 113 is connected to the first input of an AND gate 115. A second component E of the error signal is present at the second input of the AND gate 115. The output of the AND gate 115 is connected to the logical combination circuit 117.

The correction signal $\Delta v_n$ is formed at the output of the AND gate 115. The output of the AND gate 115 is connected to the first input of an XOR gate 119, at the second input of which the bit $v'_n$ to be corrected is present. A corrected value $$v_n^{cor} = v'_n + \Delta v_n$$

is provided at the output of the XOR gate 119.

Correspondingly, a subcircuit $ST_j$ (having two internal subcircuits) is provided per bit position j. The outputs of each of the subcircuits are selected by means of the component err of the error signal and are masked by means of the component E of the error signal (i.e. are or are not forwarded to the logical combination circuit 117). In this case, per bit position j the above-described arrangement of selection unit, AND gate and XOR gate is provided in order to be able to provide a corrected value $$v_j^{cor} = v'_j + \Delta v_j.$$

The logical combination circuit 117, comprising the respective XOR gates 118, 119, can also be designated as correction circuit.

By way of example, FIG. 1 can be interpreted such that the syndrome generator 101 provides a signal for n strings, wherein FIG. 1 shows by way of example two strings for j=1 and j=n. Each of the n strings is constructed in accordance with these strings shown by way of example, i.e. comprises a subcircuit $ST_j$ with a selection unit and an AND gate connected downstream, wherein the selection unit and the AND gate are driven by the error detecting unit 116 (by means of the two components err, E of the error signal). Each string furthermore comprises an XOR gate as part of the logical combination circuit 117, which logically combines the output of the AND gate (at which the signal $\Delta v_j$ is provided for the string j) with the bit $v'_j$ to be corrected and thus provides the corrected value $v_j^{cor}$ for the string. As already explained, a string is provided per bit position.

If the component err of the error signal indicates that a 4-bit error or a 3-bit error has occurred, the 0 input of the respective selection unit 112, 113 is connected to the output thereof, and the correction signal $\Delta v_1, \ldots, \Delta v_n$ (i.e. $\Delta v_j$) is determined from the m components of the locator polynomial value which are provided at the m outputs of the respective internal subcircuit $L_4(\alpha^{ij})$.

If the component err of the error signal indicates that a 2-bit error or a 1-bit error has occurred, the 1 input of the respective selection unit 112, 113 is connected to the output thereof, and the correction signal $\Delta v_j$ is determined from the m components of the locator polynomial value which are provided at the m outputs of the internal subcircuit $L_2(\alpha^{ij})$.

If no error is present, the value of the component err is arbitrary.

The component err of the error signal which is provided by the error detecting the circuit 116 is present at the respective control input of the selection units 112, 113 and its value determines which input of the selection unit is connected to the respective output.

Since the 0 input of the selection units 112, 113 is connected to the respective output both in the case of a 4-bit error and in the case of the 3-bit error, independently of whether a 4-bit error or a 3-bit error has occurred, it is not necessary for the error detecting circuit 116 to be able to distinguish between a 4-bit error and a 3-bit error.

Since the 1 input of the selection unit 112, 113 is connected to the respective output both in the case of a 2-bit error and in the case of a 1-bit error, independently of whether a 2-bit error or a 1-bit error has occurred, it is not necessary for the error detecting circuit 116 to be able to distinguish between a 2-bit error and a 1-bit error.

The syndrome generator 101 outputs an error syndrome $s = s_1, s_3, s_5, s_7$ of the word width 4·m at its 4·m-bit-wide output. In this case, the syndrome generator 101 is configured such that it determines the components of the error syndrome such that 1. $s_1^T = H_1 \cdot (v')^T$ 2. $s_3^T = H_3 \cdot (v')^T$ 3. $s_5^T = H_5 \cdot (v')^T$ 4. $s_7^T = H_7 \cdot (v')^T$ (40)

holds true, wherein the H matrix of the 4-bit error correcting BCH code is 5.

$$H = \begin{pmatrix} H_1 \\ H_3 \\ H_5 \\ H_7 \end{pmatrix} \quad (41)$$

The XOR gates of the logical combination circuit 117 (FIG. 1 shows by way of example the XOR gates 118 and 119 for the strings j=1 and j=n) logically combine the bits $v'_1, \ldots, v'_n$ to be corrected with the correction values $\Delta v_1, \ldots, \Delta v_n$ to give $$v_1^{cor} = v'_1 + \Delta v_1, \ldots, v_n^{cor} = v'_n + \Delta v_n.$$

The error syndrome s is provided to the inputs of the subcircuits 102, 103 by the syndrome generator 101. At the outputs of the AND gates 114, 115, the correction values $\Delta v_1, \ldots, \Delta v_n$ are preferably output in parallel or substantially in parallel. The syndrome generator 101 can be connected upstream of the subcircuits 102, 103 as a common circuit part. It is thus possible for the correction values $\Delta v_1, \ldots, \Delta v_n$ to be determined in parallel or substantially in parallel.

Figure 2:
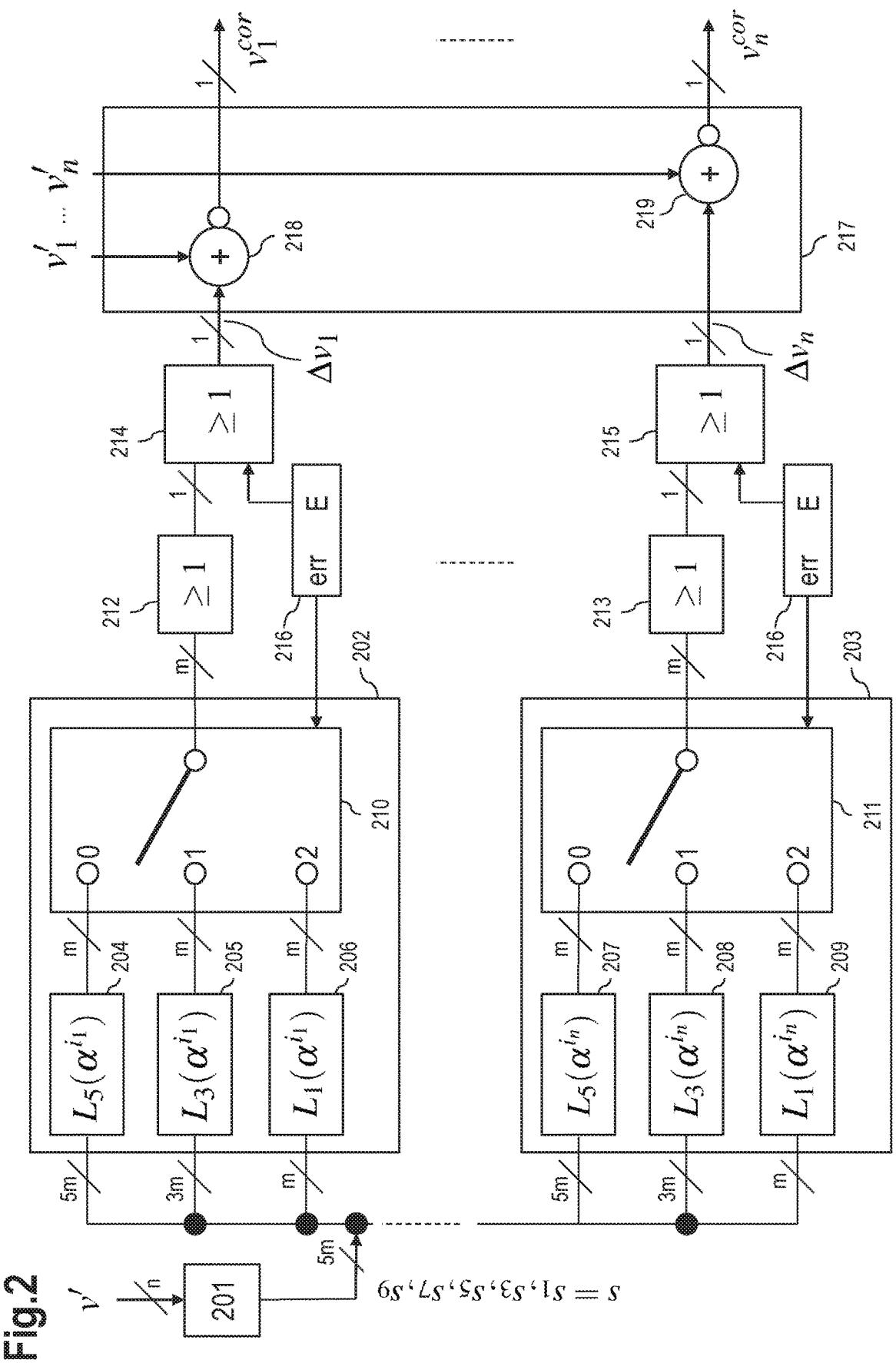
FIG. 2 shows one exemplary embodiment of a circuit arrangement using a 5-bit error correcting BCH code.

FIG. 2 shows a circuit arrangement for correcting a possibly erroneous binary word $v'=v'_1, \ldots, v'_n$ using a 5-bit error correcting BCH code over the Galois field $GF(2^m)$. The 5-bit error correcting BCH code allows a correction of 1-bit errors, 2-bit errors, 3-bit errors, 4-bit errors and 5-bit errors.

In accordance with the above explanations concerning FIG. 1, FIG. 2 also has a multiplicity of n strings, wherein a respective string j is provided for the correction of a bit position of the binary word v'.

A string j is described generally below: The string j has a subcircuit $ST_j$ comprising three internal subcircuits by way of example in FIG. 2, wherein the internal subcircuits provide the locator polynomial values $L_5(\alpha^{ij})$, $L_3(\alpha^{ij})$ and $L_1(\alpha^{ij})$. By means of a selection unit driven by a component err of the error signal, the outputs of the internal subcircuits are selectively connected via an OR gate having m inputs and a 1-bit output to the first input of a further OR gate, the second input of which is connected to the component E of the error signal. The correction signal $\Delta v_j$ of the string is provided at the output of the further OR gate, said correction signal being logically combined further via an XNOR gate with the associated bit $v'_j$ to be corrected to give a correction value $v_j^{cor}$. The XNOR gates of the individual strings can be combined in a logical combination circuit (also designated as correction circuit). The respective selection unit can be part of the subcircuit $ST_j$ or can be embodied separately from the latter. In FIG. 2, the subcircuit $ST_j$ comprises by way of example the internal subcircuits for determining the locator polynomial values and also the selection unit following the outputs thereof. In principle, each of the subcircuits $ST_j$ can also comprise more or fewer elements of the string j.

FIG. 2 shows by way of example two strings for the bit positions j=1 and j=n. The remaining strings for j=2, ..., n−1 are indicated by dotted lines in FIG. 2.

The first string shown in FIG. 2 comprises a subcircuit 202 having an internal subcircuit 204 for determining the locator polynomial value $L_5(\alpha^{ij})$, an internal subcircuit 205 for determining the locator polynomial value $L_3(\alpha^{ij})$ and an internal subcircuit 206 for determining the locator polynomial value $L_1(\alpha^{ij})$. The output of the internal subcircuit 204 provides an m-dimensional signal to the 0 input of a selection unit 210. The output of the internal subcircuit 205 provides an m-dimensional signal to the 1 input of the selection unit 210. The output of the internal subcircuit 206 provides an m-dimensional signal to the 2 input of the selection unit 210. The corresponding input of the selection unit 210 is selected via the component err of the error signal. The selection unit 210 supplies an m-dimensional signal to an OR gate 212 having m inputs and an output. The OR gate 212 supplies the value 0 at its output only if all m bits at its inputs are binary 0. Otherwise the binary value 1 is present at the output of the OR gate 212. The output of the OR gate 212 is connected to the first input of an OR gate 214. The component E of the error signal is present at the second input of the OR gate 214. The error signal, i.e. the components err, E of the error signal, are provided by an error detecting unit 216. The error signal can be used for all strings j.

At the output of the OR gate 214, a correction signal $\Delta v_1$ is provided to the first input of an XNOR gate 218. The bit $v'_1$ to be corrected is present at the second input of the XNOR gate 218. The correction value $v_1^{cor}$ for the bit position 1 is provided at the output of the XNOR gate 218.

The above explanations correspondingly hold true for the string j=n: here a subcircuit 203 having internal subcircuits 207 to 209 is shown, said internal subcircuits being connected to a selection unit 211. The internal subcircuits 207 to 209 provide the locator polynomial values $L_5(\alpha^{in})$, $L_3(\alpha^{in})$ and $L_1(\alpha^{in})$. The output of the selection unit 211 is connected via two OR gates 213 and 215 to an XNOR gate 219, which in this case provides the correction value $v_n^{cor}$ for the bit position n. The selection of the selection unit 211 is performed via the component err of the error signal and the second input of the OR gate 215 (like the second input of the OR gate 214 previously) is connected to the component E of the error signal.

Each of the subcircuits $ST_j$ has 5·m inputs for inputting the syndrome components $s_1, s_3, s_5, s_7, s_9$ that are provided by a syndrome generator 201.

The syndrome components $s_1, s_3, s_5, s_7, s_9$ are fed to the 5·m-bit-wide input of the internal subcircuit which determines the locator polynomial values $L_5(\alpha^{ij})$. The syndrome components $s_1, s_3, s_5$ are fed to the 3·m-bit-wide input of the internal subcircuit which determines the locator polynomial values $L_3(\alpha^{ij})$. The m-bit-wide syndrome component $s_1$ is fed to the m-bit-wide input of the internal subcircuit which determines the locator polynomial values $L_1(\alpha^{ij})$.

If a bit position j of the binary word v' is erroneous and a 5-bit error or a 4-bit error is present, at the m outputs of the internal subcircuit which determines the locator polynomial value $L_5(\alpha^{ij})$ there is provided an m-digit locator polynomial value $$\underbrace{0, \ldots, 0}_{m}$$

(this locator polynomial value is also abbreviated to $\{0\}_m$).

If the bit position j is not erroneous and a 5-bit error or a 4-bit error is present at different bit positions, at the m outputs of the internal subcircuit which determines the locator polynomial value according to $L_5(\alpha^{ij})$ there is provided a value different than the locator polynomial value, that is to say a value which is not equal to $\{0\}_m$.

If the bit position j is erroneous and a 3-bit error or a 2-bit error is present at different bit positions, the m-digit locator polynomial value $\{0\}_m$ is provided at the m outputs of the internal subcircuit which determines the locator polynomial value according to $L_3(\alpha^{ij})$.

If the bit position j is not erroneous and a 3-bit error or a 2-bit error is present at different bit positions, a value different than the locator polynomial value $\{0\}_m$ is provided at the m outputs of the internal subcircuit which determines the locator polynomial value according to $L_3(\alpha^{ij})$.

If the bit position j is erroneous and a 1-bit error is present, the m-digit locator polynomial value $\{0\}_m$ is provided at the m outputs of the internal subcircuit which determines the locator polynomial value according to $L_1(a\alpha^{ij})$.

If the bit position j is not erroneous and a 1-bit error is present at a bit position different than j, a value different than the locator polynomial value $\{0\}_m$ is provided at the m outputs of the internal subcircuit which determines the locator polynomial value according to $L_1(a\alpha^{ij})$.

The respective selection unit (e.g. the selection unit 210, 211) is configured such that
  if the component err of the error signal indicates a 4-bit error or a 5-bit error (i.e. err=0), the 0 input of the selection unit is connected to the output thereof,
  if the component err of the error signal indicates a 2-bit error or a 3-bit error (i.e. err=1), the 1 input of the selection unit is connected to the output thereof, and if the component err of the error signal indicates a 1-bit error (i.e. err=2), the 2 input of the selection unit is connected to the output thereof.

If no error is present, the value of the component err of the error signal is e.g. arbitrary.

In the case of an error at the bit position j, the subcircuit $ST_j$ outputs at its m-dimensional output, which is also the output of the selection unit provided for this string, the m-dimensional locator polynomial value $\{0\}_m$ in the case of a 5-bit error, a 4-bit error, a 3-bit error, a 2-bit error or a 1-bit error.

If no error is present at the bit position j, the subcircuit $ST_j$ outputs at its m-dimensional output, which is also the output of the selection unit provided for this string, a value different than the m-dimensional locator polynomial value $\{0\}_m$ in the case of a 5-bit error, a 4-bit error, a 3-bit error, a 2-bit error or a 1-bit error.

The determination of the corrected value $v_j^{cor}$ is explained below by way of example for the string j=1. Since the individual strings are constructed identically, these explanations correspondingly hold true for an arbitrary bit position j.

The m-dimensional output of the selection unit 210 is connected to the m-dimensional input of the OR gate 212. At the 1-dimensional output of the OR gate 212, the binary value 0 is output precisely if the locator polynomial value $\{0\}_m$ is present at the input thereof (that is to say all m bits have the value 0). If a locator polynomial value different therefrom is present at the input of the OR gate 212, then the binary value 1 is present at the output thereof.

The component E of the error signal is binary 1 if no error has occurred and if the error syndrome is equal to 0. Correspondingly, the component E of the error signal is binary 0 if an error has occurred and if the error syndrome is not equal to 0.

At the 1-bit-wide output of the OR gate 214, the correction signal $\Delta v_j$ (where j=1) is output and is logically combined in the XNOR gate 218 with the possibly erroneous bit $v'_j$ to give $$v_j^{cor} = v'_j \text{ XNOR } \Delta v_j = \overline{v'_j \oplus \Delta v_j}.$$

In the present case, the string of the first bit position was considered, and j=1 correspondingly holds true. The explanations correspondingly hold true, as was explained above, for the bit positions j=2, ..., j=n.

The respective XNOR gates 218, 219 can be part of a logical combination circuit 217. Said logical combination circuit 217 can also be regarded as a correction circuit.

It should be noted here that the XNOR gate performs the function (exclusive-NOR); a logic 1 is present at its output precisely if 1 is present at both inputs or 0 is present at both inputs. The XNOR function is also designated as equivalence.

The syndrome generator 201 provides the 5·m-dimensional error syndrome $$s = s_1, s_3, s_5, s_7, s_9$$

which is present at the 5·m-dimensional input of the respective subcircuit $ST_j$. The error syndrome provided by the syndrome generator 201 is determined here such that 1. $s_1^T = H_1 \cdot (v')^T$ 2. $s_3^T = H_3 \cdot (v')^T$ 3. $s_5^T = H_5 \cdot (v')^T$ 4. $s_7^T = H_7 \cdot (v')^T$ 5. $s_9^T = H_9 \cdot (v')^T$ \hfill (42)

holds true, wherein the H matrix of the 5-bit error correcting BCH code is 6.

$$H = \begin{pmatrix} H_1 \\ H_3 \\ H_5 \\ H_7 \\ H_9 \end{pmatrix}. \hfill (43)$$

If a 1-bit error, 2-bit error, 3-bit error, 4-bit error or 5-bit error is present and the j-th bit is erroneous, in the circuit arrangement in FIG. 2 the value of the correction signal is $\Delta v_j = 0$. If no error is present in the j-th bit, the correction signal is correspondingly $\Delta v_j = 1$.

Depending on the number of errors which occurred, it is determined whether the correction value $\Delta v_j$ is determined using a first internal subcircuit, a second internal subcircuit or a third internal subcircuit, wherein the first OR gate (212, 213) is connected downstream of each internal subcircuit. The first OR gate (212, 213) can thus be realized as part of the respective internal subcircuit or separately from the latter. Via the selection unit (210, 211), it is possible to use the first OR gate (212, 213) jointly for a plurality of internal subcircuits, wherein one of the internal subcircuits is selectable via the selection unit by means of the component err of the error signal.

Particularly since the syndrome generator 201 is jointly connected upstream of the subcircuits 202, 203, the correction signals $\Delta v_1, \ldots, \Delta v_n$ can be determined in parallel or substantially in parallel. By way of example, it is possible for the correction signals $\Delta v_1, \ldots, \Delta v_n$ to be provided at identical clock cycles, i.e. substantially simultaneously.

On account of the higher complexity of the internal subcircuits 204, 207 in comparison with the complexity of the internal subcircuits 206, 209, the correction of a 5-bit error may require more time than the correction of a 1-bit error. By way of example, one option is for the correction of the 1-bit error to be effected during one clock cycle, whereas the correction of the 5-bit error requires a plurality of clock cycles.

Figure 3:
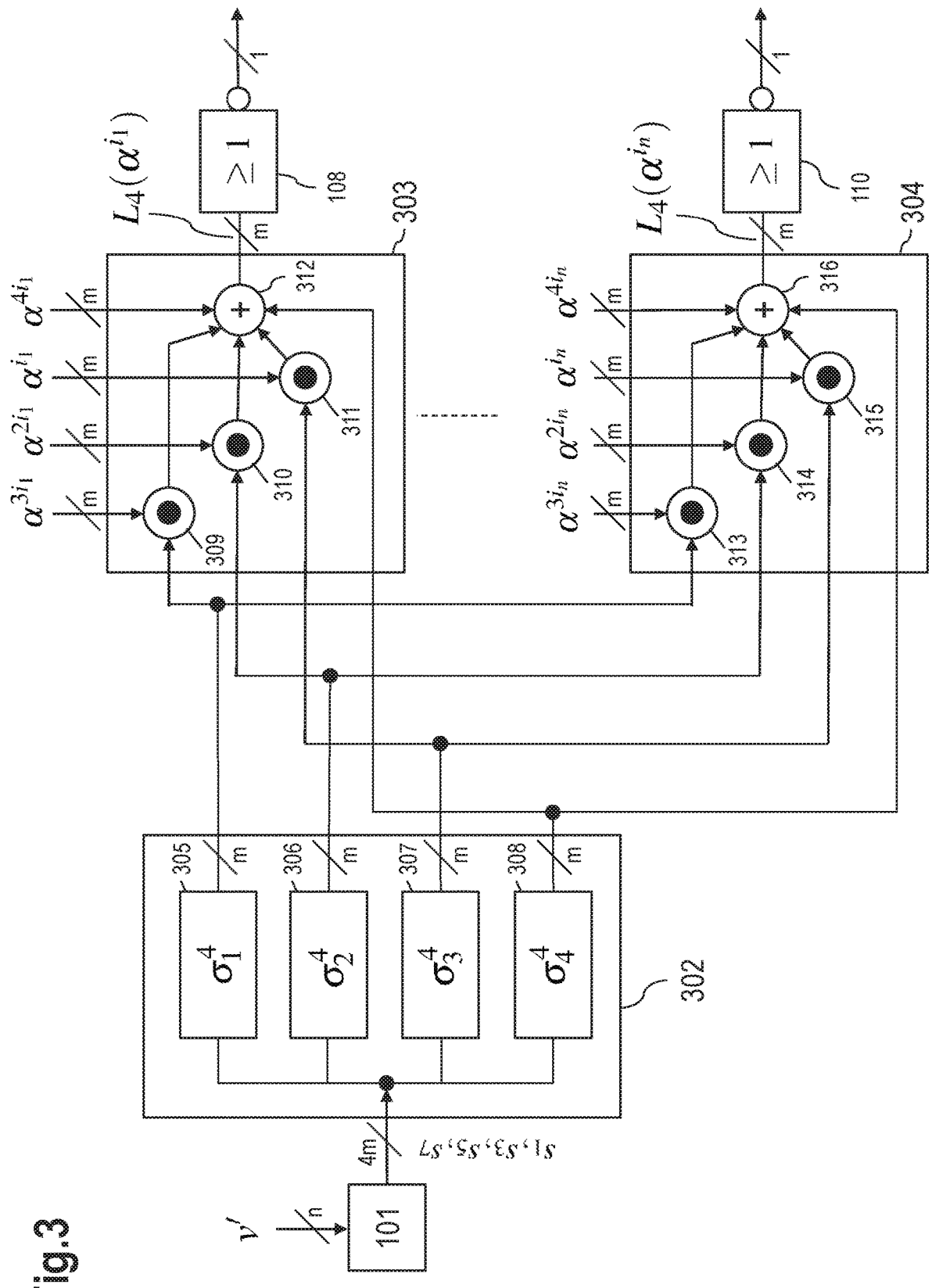
FIG. 3 shows one exemplary embodiment of subcircuits of a circuit arrangement from FIG. 1.

FIG. 3 shows a diagram of one exemplary implementation of the internal subcircuits 104 and 106 from FIG. 1. The internal subcircuit 104 provides the locator polynomial value $L_4(\alpha^{i_1})$ and the internal subcircuit 106 provides the locator polynomial value $L_4(\alpha^{i_n})$. As shown in FIG. 1, the NOR gate 108 is connected downstream of the internal subcircuit 104 and the NOR gate 110 is connected downstream of the internal subcircuit 106.

In FIG. 3 the internal subcircuit 104 is divided into a central circuit part 302 and into a local circuit part 303. Correspondingly, the internal subcircuit 106 is subdivided into the central circuit part 302 and a local circuit part 304. The central circuit part 302 is used for all the internal subcircuits for determining the locator polynomial values $L_4(\alpha^{i_j})$, wherein each of the internal subcircuits additionally has a dedicated local circuit part (shown for the internal subcircuits 303 and 304 by way of example in FIG. 3).

In accordance with the illustration in FIG. 1, only the two strings for the bit positions j=1 and j=n are shown in FIG. 3. The strings for the bit positions j=2, ..., n−1 are arranged therebetween, these strings being constructed correspondingly and not being illustrated in FIG. 3 for the sake of clarity.

The central circuit part 302 determines in a unit 305 the value of the coefficient $\sigma_1^4$, in a unit 306 the value of the coefficient $\sigma_2^4$, in a unit 307 the value of the coefficient $\sigma_3^4$ and in a unit 308 the value of the coefficient $\sigma_4^4$ of the locator polynomial of $4^{th}$ degree on the basis of the partial syndromes $s_1, s_3, s_5, s_7$ present at its 4·m-bit-wide input. As illustrated in FIG. 1, the partial syndromes are provided by the syndrome generator 101. The units 305 to 308 each have a 4·m-bit-wide input and an m-bit-wide output.

Furthermore, n local circuit parts (shown by way of example for the bit position j=1 as local circuit part 303 and for the bit position j=n as local circuit part 304) are present, which determine the locator polynomial values of $L_4(\alpha^{i_1}), \ldots, L_4(\alpha^{i_n})$ from the coefficients $\sigma_1^4, \sigma_2^4, \sigma_3^4$ and $\sigma_4^4$ provided by the units 305 to 308.

By way of example, the local circuit part 303 for the bit position j=1 is explained below:

The output of the unit 305 is connected to the first input of a multiplier 309. A constant value $\alpha^{3i_1}$ is present at the second input of the multiplier 309. The output of the multiplier 309 is connected to the first m-bit-wide input of an XOR gate 312. The XOR gate 312 is realized in particular as an XOR circuit having 5 m-bit-wide inputs and an m-bit-wide output.

The output of the unit 306 is connected to the first input of a multiplier 310. A constant value $\alpha^{2i_1}$ is present at the second input of the multiplier 310. The output of the multiplier 310 is connected to the second m-bit-wide input of the XOR gate 312.

The output of the unit 307 is connected to the first input of a multiplier 311. A constant value $\alpha^{i_1}$ is present at the second input of the multiplier 311. The output of the multiplier 311 is connected to the third m-bit-wide input of the XOR gate 312.

The output of the unit 308 is connected to the fourth m-bit-wide input of the XOR gate 312.

A constant value $\alpha^{4i_1}$ is present at the fifth m-bit-wide input of the XOR gate 312.

The XOR gate 312 provides at its output the value $$L_4(\alpha^{i_1}) = \sigma_1^4 \cdot \alpha^{3i_1} + \sigma_2^4 \cdot \alpha^{2i_1} + \sigma_3^4 \cdot \alpha^{i_1} + \sigma_4^4 + \alpha^{4i_1}.$$

A multiplier carries out a multiplication in the Galois field $GF(2^m)$. Such a multiplier can also be designated as a Galois field multiplier. A multiplier having two m-bit-wide inputs, wherein a constant value is present at one of the inputs, is also designated as a constant multiplier.

The explanations correspondingly hold true for the local circuit part 304 for the bit position j=n. The output of the respective local circuit part 303, 304 is connected to the respective NOR gate 108, 110 (in this respect, also see FIG. 1). In FIG. 3, the multipliers 313 to 315 and the XOR gate 316 are correspondingly shown for the circuit part 304.

It generally holds true that: the central circuit part 302 having the units 305 to 308 is jointly used for all strings or bit positions j. Per string or bit position j there is a dedicated local circuit part $LST_j$ having three multipliers $M1_j, M2_j$ and $M3_j$ and an XOR gate $XOR_j$.

For the bit position j=1, ..., n it holds true that:

The output of the unit 305 is connected to an m-bit-wide first input of the multiplier $M1_j$, at the second input of which a constant value $\alpha^{3ij}$ is present. The output of the multiplier $M1_j$ is connected to the m-bit-wide first input of the XOR gate $XOR_j$ and supplies the value $\alpha^{3ij} \cdot \sigma_1^4$ to the XOR gate $XOR_j$.

The output of the unit 306 is connected to an m-bit-wide first input of the multiplier $M2_j$, at the second input of which a constant value $\alpha^{2ij}$ is present. The output of the multiplier $M2_j$ is connected to the m-bit-wide second input of the XOR gate $XOR_j$ and supplies the value $\alpha^{2ij} \cdot \sigma_2^4$ to the XOR gate $XOR_j$.

The output of the unit 307 is connected to an m-bit-wide first input of the multiplier $M3_j$, at the second input of which a constant value $\alpha^{ij}$ is present. The output of the multiplier $M3_j$ is connected to the m-bit-wide third input of the XOR gate $XOR_j$ and supplies the value $\alpha^{ij} \cdot \sigma_3^4$ to the XOR gate $XOR_j$.

The output of the unit 308 is connected to an m-bit-wide fourth input of the XOR gate $XOR_j$ and supplies the value $\sigma_4^4$ to the XOR gate $XOR_j$.

The value $\alpha^{4ij}$ is present at an m-bit-wide fifth input of the XOR gate $XOR_j$. Consequently, the XOR gate $XOR_j$ supplies at its m-bit-wide output the value $$i\, L_4(\alpha^{ij}) = \sigma_1^4 \cdot \alpha^{3ij} + \sigma_2^4 \cdot \alpha^{2ij} + \sigma_3^4 \cdot \alpha^{ij} + \sigma_4^4 + \alpha^{4ij},$$

wherein "+" here denotes the component-by-component addition modulo 2 or component-by-component XOR-ing.

The output of the XOR gate $XOR_j$ is connected to an m-bit-wide input of the downstream NOR gate (a NOR gate is provided per bit position j). The respective NOR gate has an m-bit-wide input and a 1-bit-wide output.

The unit 305 is configured such that depending on the partial syndrome $s_1$ present at the input thereof a value $$\sigma_1^4 = s_1$$

is formed and is provided at the output thereof.

The unit 306 is configured such that depending on partial syndromes $s_1, s_3, s_5, s_7$ present at the input thereof a value $$\sigma_2^4 = \frac{s_1 s_7 + s_3 s_5 + s_1^5(s_3 + s_1^3)}{s_1 s_5 + s_3^2 + s_1^3 s_3 + s_1^6}$$

is formed and is provided at the output thereof.

The unit 307 is configured such that depending on partial syndromes $s_1, s_3, s_5, s_7$ present at the input thereof, a value $$\sigma_3^4 = \frac{s_1^2 s_7 + s_1^4 s_5 + s_3(s_3 + s_1^3)^2}{s_1 s_5 + s_3^2 + s_1^3 s_3 + s_1^6}$$

is formed and is provided at the output thereof.

The unit 308 is configured such that depending on partial syndromes $s_1, s_3, s_5, s_7$ present at the input thereof, a value $$\sigma_4^4 = \frac{(s_7 + s_1^2 s_5 + s_1 s_3^2 + s_1^4 s_3)(s_3 + s_1^3) + (s_5 + s_1^5)^2}{s_1 s_5 + s_3^2 + s_1^3 s_3 + s_1^6}$$

is formed and is provided at the output thereof.

The implementation of the units 305 to 308 for determining the values $\sigma_1^4, \sigma_2^4, \sigma_3^4$ and $\sigma_4^4$ can be effected in accordance with the specified relationships using known Galois field multipliers, component-by-component XOR functions and a known division in the Galois field from the partial syndromes.

The multipliers $M1_j, M2_j$ and $M3_j$(or 309 to 311 for j=1 and 313 to 315 for j=n) can be realized as XOR functions.

The central circuit part 302 is used for all subcircuits for determining the locator polynomial values $L_4(x^{ij})$ where j=1, ..., n. The central circuit part 302 is thus connected upstream of the local circuit parts 303, 304. Preferably, the locator polynomial values $L_4(x^{ij})$ in accordance with the illustration in FIG. 3 can be provided in parallel or substantially in parallel (e.g. with a joint clock). Consequently, the locator polynomial values and thus the correction signals can be determined in parallel or substantially in parallel.

Figure 4:
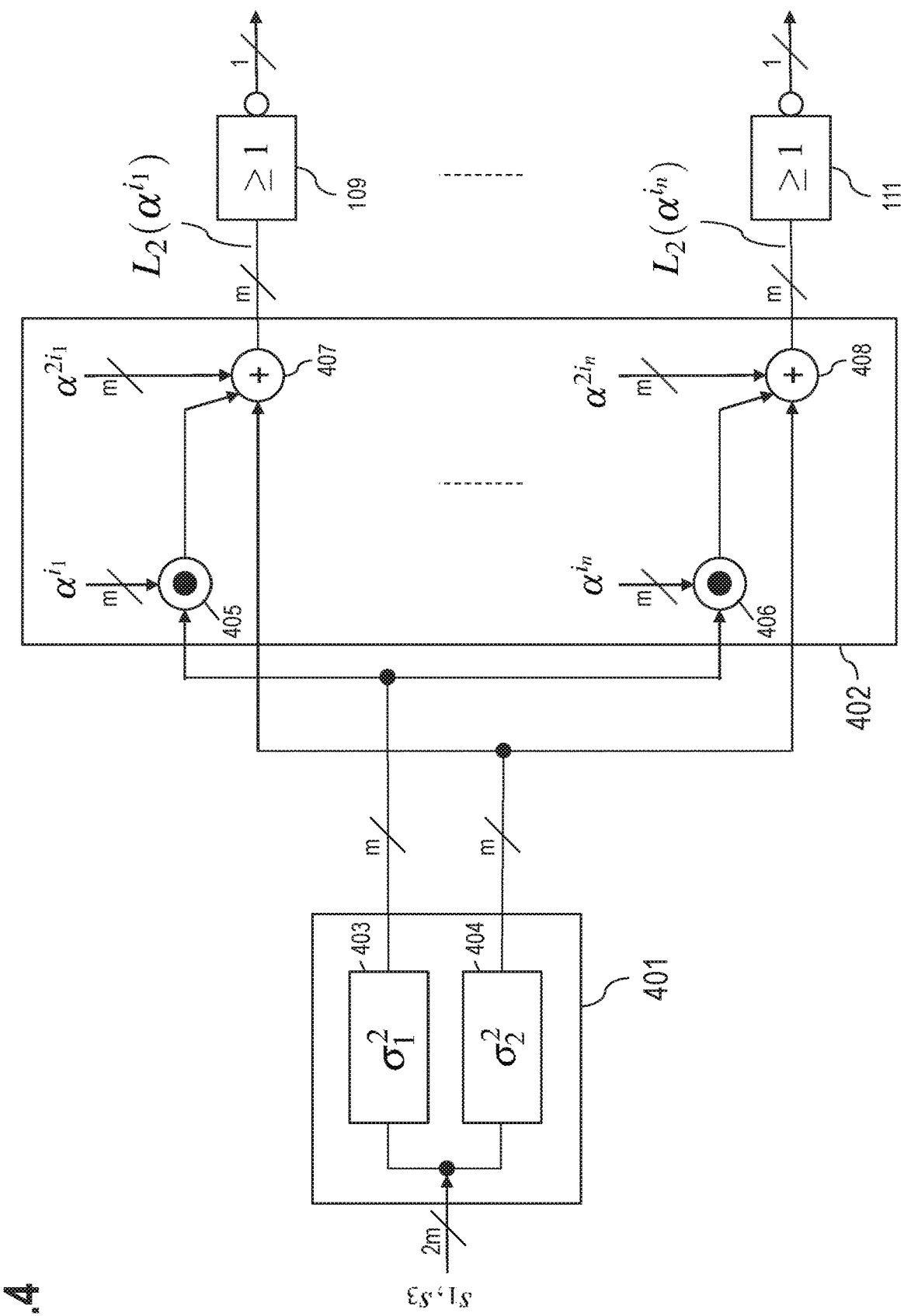
FIG. 4 shows one exemplary embodiment of subcircuits of a circuit arrangement from FIG. 1.

FIG. 4 shows, as a supplementation to the illustration in FIG. 1, one exemplary implementation of the internal subcircuits 105 and 107 which provide the locator polynomial values $L_2(\alpha^{ij})$ for $j=1, \ldots, n$ for the case where either a 2-bit error or a 1-bit error has occurred. The internal subcircuits 105 and 107 here are distributed for example between a central circuit part 401 and a local circuit part 402, wherein the central circuit part 401 is used for both internal subcircuits 105 and 107 and, in addition, an individual local circuit part is also provided for each of the internal subcircuits 105 and 107. In the example in accordance with FIG. 4, the individual local circuit parts are combined in the circuit part 402. Depending on the implementation, the local circuit parts can also be realized separately from one another (as explained by way of example in FIG. 3).

The central circuit part 401 comprises a unit 403 for determining $\sigma_1^2$ and a unit 404 for determining $\sigma_2^2$. Both the unit 403 and the unit 404 have a 2·m-wide input at which the partial syndromes $s_1$, $s_3$ are present, which are provided by the syndrome generator (not illustrated in FIG. 4). Each of the units 403 and 404 has an m-bit-wide output at which the values $\sigma_1^2$ and $\sigma_2^2$ are made available to the local circuit part 402.

The local circuit part 402 comprises for each bit position j a local circuit part (in FIG. 4 the local circuit parts are combined by way of example in the block 402); thus there are n local circuit parts of this type which determine the locator polynomial values $L_2(\alpha^{i_1}), \ldots, L_2(\alpha^{i_n})$ from the values of the coefficients $\sigma_1^2$ and $\sigma_2^2$.

The central circuit part 401 having the units 403 and 404 is jointly used for all strings or bit positions j in this exemplary embodiment. Per string or bit position j there is a dedicated local circuit part $STL_j$ with a multiplier $MP_j$ and an XOR gate $EX_j$.

For the bit position $j=1, \ldots, n$ it generally holds true that:
The output of the unit 403 is connected to an m-bit-wide first input of the multiplier $MP_j$, at the second input of which a constant value $\alpha^{ij}$ is present. The output of the multiplier $MP_j$ is connected to the m-bit-wide input of the XOR gate $EX_j$ and supplies the value $$\alpha^{ij} \cdot \sigma_1^2$$

to the XOR gate $EX_j$.
The output of the unit 404 is connected to an m-bit-wide second input of the XOR gate $EX_j$.
The value $\alpha^{2ij}$ is present at the m-bit-wide third input of the XOR gate $EX_j$. Consequently, the XOR gate $EX_j$ supplies at its m-bit-wide output the value $$i\ L_2(\alpha^{ij})=\sigma_1^2 \cdot \alpha^{ij}+\sigma_2^2 \cdot \alpha^{2ij}.$$

The output of the XOR gate $EX_j$ is connected to the m-bit-wide input of the NOR gate for the respective string (cf. FIG. 1).

FIG. 4 shows by way of example only the two strings for the bit positions $j=1$ and $j=n$. The strings for the bit positions $j=2, \ldots, n-1$ are arranged therebetween, these strings being constructed correspondingly and not being illustrated in FIG. 4 for the sake of clarity.

For the string $j=1$, the following reference signs are used for its local circuit part: the multiplier $MP_1$ is provided with the reference sign 405 and the XOR gate $EX_1$ has the reference sign 407. Furthermore, the NOR gate 109 from FIG. 1 is illustrated, which is connected to the output of the XOR gate 407.

For the string $j=n$, the following reference signs are used for its local circuit part: the multiplier $MP_n$ is provided with the reference sign 406 and the XOR gate $EX_n$ has the reference sign 408. Furthermore, the NOR gate 111 from FIG. 1 is illustrated, which is connected to the output of the XOR gate 408.

The unit 403 is configured such that depending on the partial syndrome $s_1$ present at the input thereof a value $$\sigma_1^2 = s_1$$

is formed and is provided at the output thereof.

The unit 404 is configured such that depending on partial syndromes $s_1$, $s_3$ present at the input thereof a value $$\sigma_2^2 = \frac{s_3 + s_1^3}{s_1}$$

is formed and is provided at the output thereof.

Figure 5:
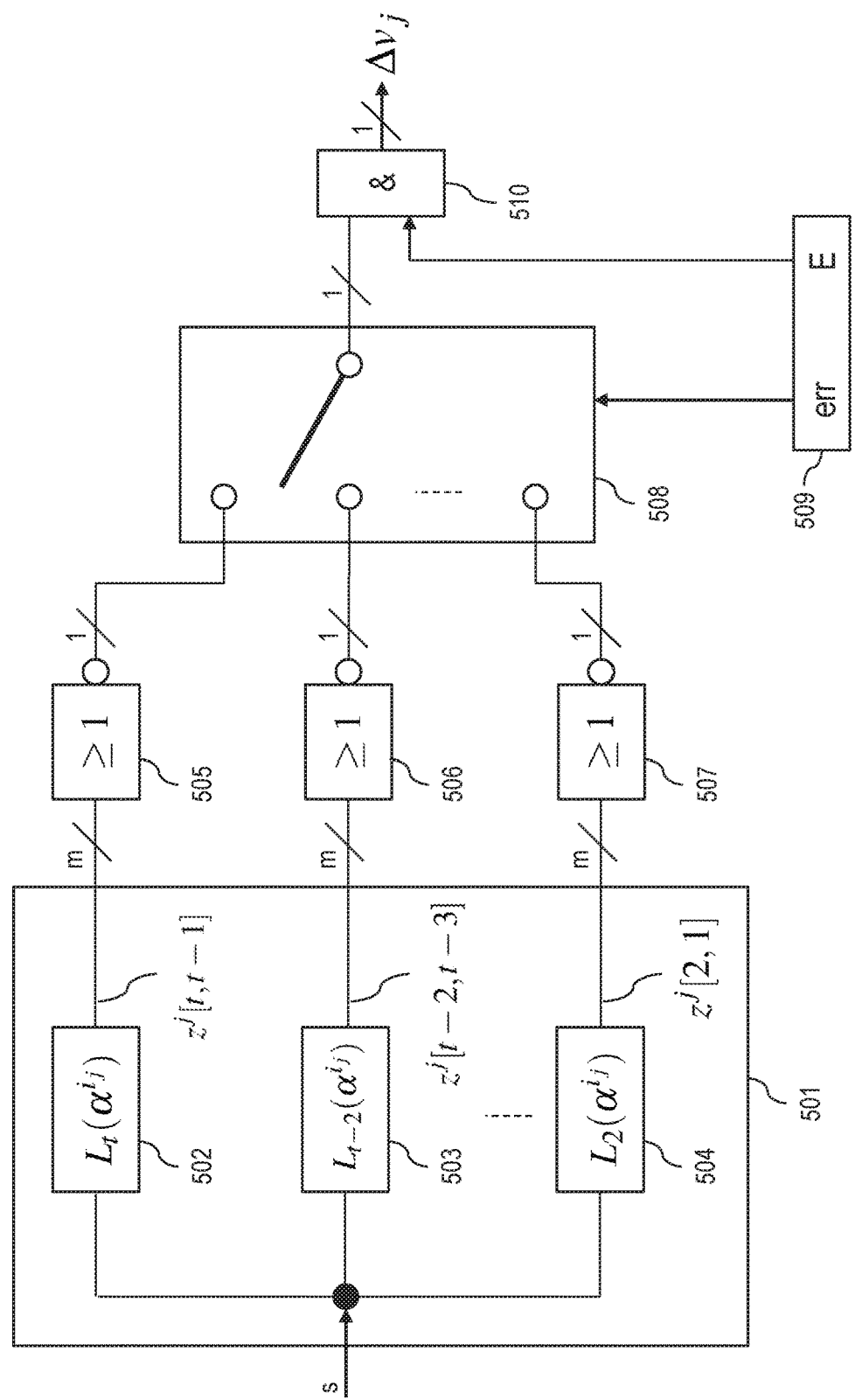
FIG. 5 shows one possible implementation of a subcircuit for correcting a bit $v'_i$ using a t-bit error correcting code if t is an even number.

FIG. 5 shows an exemplary circuit arrangement for determining a correction value $\Delta v_j$ if the correction is effected using a t-bit error correcting BCH code. In this case, t is an even number, for example.

FIG. 5 shows a subcircuit 501 (also designated as subcircuit $ST_j$ for the bit position j or the string j) having internal subcircuits 502 to 504. The subcircuit 501 has a t·m-bit-wide input, at which the error syndrome s with its t components $s_1, s_3, \ldots, s_{2t-1}$ is present.

The internal subcircuit 502 provides a locator polynomial value $$L_t(\alpha^{ij})=z^j[t,t-1]$$

and outputs the m-dimensional value $z^j[t, t-1]$ at its m-dimensional output. The output of the internal subcircuit 502 is connected to an m-dimensional input of a NOR gate 505 having a 1-bit-wide output connected to the first input of a selection unit 508.

The internal subcircuit 503 provides a locator polynomial value $$L_{t-2}(\alpha^{ij})=z^j[t-2,t-3]$$

and outputs the m-dimensional value $z^j[t-2, t-3]$ at its m-dimensional output. The output of the internal subcircuit 503 is connected to an m-dimensional input of a NOR gate 506 having a 1-bit-wide output connected to the second input of a selection unit 508.

The internal subcircuit 504 provides a locator polynomial value $$L_2(\alpha^{ij})=z^j[2,1]$$

and outputs the m-dimensional value $z^j[2,1]$ at its m-dimensional output. The output of the internal subcircuit 504 is connected to an m-dimensional input of a NOR gate 507 having a 1-bit-wide output connected to the t/2-th input of a selection unit 508.

Consequently, the selection unit 508 has a number of inputs amounting to half the number that can be corrected by the bit error correcting code.

If the bit $v'_j$ is erroneous, it holds true that:
if a t-bit error or a (t−1)-bit error is present, the locator polynomial value $$z^j[t,t-1]=\{0\}_m$$

is output at the m first outputs of the subcircuit $ST_j$, which here correspond to the outputs of the internal subcircuit 502 with the aid of which the locator polynomial values $L_t(\alpha^{ij})$ are provided.

If a (t−2)-bit error or a (t−3)-bit error is present, the locator polynomial value $$z^j[t-2,t-3]=\{0\}_m$$

is output at the m second outputs of the subcircuit $ST_j$, which here correspond to the outputs of the internal subcircuit 503 with the aid of which the locator polynomial values $L_{t-2}(\alpha^{ij})$ are provided.

These explanations can be correspondingly continued for bit errors t−q and t−q−1 where q=4, 6, 8, . . . until the 2-bit errors and the 1-bit errors are finally reached (see following point).

If a 2-bit error or a 1-bit error is present, the locator polynomial value $$z^j[2,1]=\{0\}_m$$

is output at m t/2-th outputs of the subcircuit $ST_j$, which here correspond to the outputs of the internal subcircuit 504 with the aid of which the locator polynomial values $L_2(\alpha^{ij})$ are provided.

If the bit $v'_j$ is not erroneous, it holds true that:
if a t-bit error or a (t−1)-bit error is present, the locator polynomial value $$z^j[t,t-1]=\{0\}_m$$

is output at the m first outputs of the subcircuit $ST_j$, which here correspond to the outputs of the internal subcircuit 502 with the aid of which the locator polynomial values $L_t(\alpha^{ij})$ are provided.

If a (t−2)-bit error or a (t−3)-bit error is present, the locator polynomial value $$z^j[t-2,t-3]\neq\{0\}_m$$

is output at the m second outputs of the subcircuit $ST_j$, which here correspond to the outputs of the internal subcircuit 503 with the aid of which the locator polynomial values $L_{t-2}(\alpha^{ij})$ are provided.

These explanations can be correspondingly continued for bit errors t−q and t−q−1 where q=4, 6, 8, . . . until the 2-bit errors and the 1-bit errors are finally reached (see following point).

If a 2-bit error or a 1-bit error is present, the locator polynomial value $$z^j[2,1]\neq\{0\}_m$$

is output at the m t/2th outputs of the subcircuit $ST_j$, which here correspond to the outputs of the internal subcircuit 504 with the aid of which the locator polynomial values $L_2(\alpha^{ij})$ are provided.

Depending on a number of the errors that have occurred, a value of the component err of the error signal provided by an error detection 509 of the selection unit 508 determines which of the inputs of the selection unit 508 is connected to the output thereof. The output of the selection unit 508 is connected to the first input of an AND gate 510. The component E of the error signal is present at the second input of the AND gate 510, said component likewise being provided by the error detection 509. The output of the AND gate 510 provides the correction value $\Delta v_j$ for the possibly erroneous bit $v'_j$.

If a t-bit error or a (t−1)-bit error is present, the selection unit connects its first input to its output and the value $z^j=z^j[t, t−1]$ provided at the output of the internal subcircuit 502 determines whether $\Delta v_j=1$ or $\Delta v_j=0$:

$\Delta v_j=1$ in the case where $z^j[t, t-1]=\{0\}_m$.
$\Delta v_j=0$ in the case where $z^j[t, t-1]\neq\{0\}_m$.

If a (t−2)-bit error or a (t−3)-bit error is present, the selection unit 508 connects its second input to its output and the value $z^j=z^j[t-2, t-3]$ provided at the output of the internal subcircuit 503 determines whether $\Delta v_j=1$ or $\Delta v_j=0$.

$\Delta v_j=1$ in the case where $z^j[t-2, t-3]=\{0\}_m$.
$\Delta v_j=0$ in the case where $z^j[t-2, t-3]\neq\{0\}_m$.

This consideration can correspondingly be continued for subsequent pairs of bit errors $$\{(t-5);(t-4)\},\{(t-7);(t-6)\},\ldots$$

until reaching the pair of the 2-bit error and 1-bit error explained below.

If a 2-bit error or a 1-bit error is finally present, the selection unit 508 connects its t/2th input to its output and the value $z^j=z^j[2,1]$ provided at the output of the internal subcircuit 504 determines whether $\Delta v_j=1$ or $\Delta v_j=0$.

$\Delta v_j=1$ in the case where $z^j[2,1]=\{0\}_m$.
$\Delta v_j=0$ in the case where $z^j[2,1]\neq\{0\}_m$.

If no error is present, the value of the component E of the error signal is equal to zero (E=0) and it holds true that: $\Delta v_j=0$.

Figure 6:
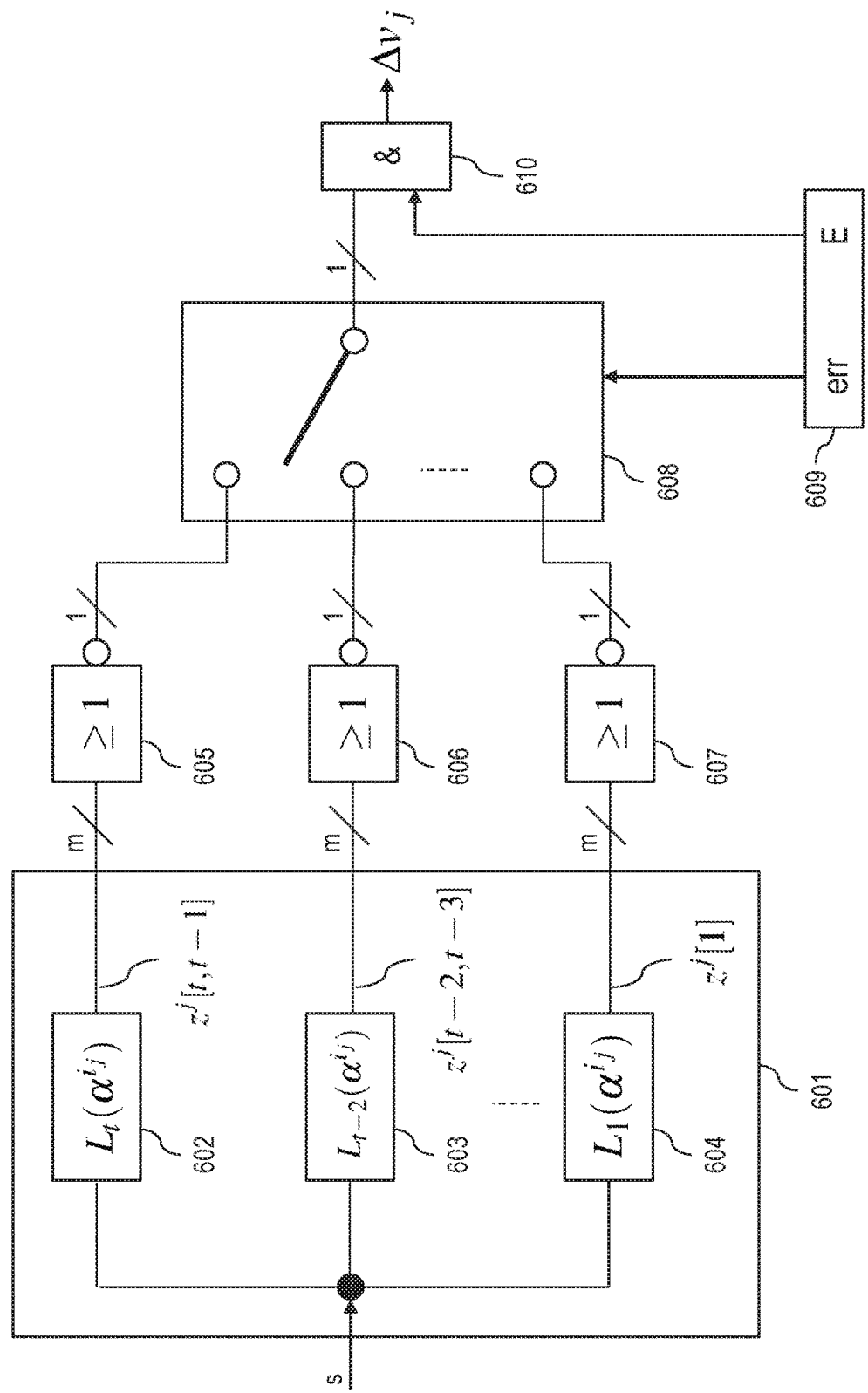
FIG. 6 shows one possible implementation of a subcircuit for correcting a bit $v'_i$ using a t-bit error correcting code if t is an odd number.

FIG. 6 shows an exemplary circuit arrangement for determining a correction value $\Delta v_j$ if the correction is effected using a t-bit error correcting BCH code. In this case, t is an odd number, for example.

FIG. 6 shows a subcircuit 601 (also designated as subcircuit $ST_j$ for the bit position j or the string j) having internal subcircuits 602 to 604. The subcircuit 601 has a t·m-bit-wide input, at which the error syndrome s with its t components $s_1, s_3, \ldots, s_{2t-1}$ is present.

The internal subcircuit 602 provides a locator polynomial value $L_t(\alpha^{ij})$ and outputs an m-dimensional value $$z^j[t,t-1]$$

at its m-dimensional output. The output of the internal subcircuit 602 is connected to an m-dimensional input of a NOR gate 605 having a 1-bit-wide output connected to the first input of a selection unit 608.

The internal subcircuit 603 provides a locator polynomial value $L_{t-2}(\alpha^{ij})$ and outputs an m-dimensional value $$z^j[t-2,t-3]$$

at its m-dimensional output. The output of the internal subcircuit 603 is connected to an m-dimensional input of a NOR gate 606 having a 1-bit-wide output connected to the second input of a selection unit 608.

The internal subcircuit 604 provides a locator polynomial value $L_1(\alpha^{ij})$ and outputs an m-dimensional value $$z^j[1]$$

at its m-dimensional output. The output of the internal subcircuit 604 is connected to an m-dimensional input of a NOR gate 607 having a 1-bit-wide output connected to the (t+1)/2th input of a selection unit 608.

If the bit $v'_j$ is erroneous, it holds true that:
if a t-bit error or a (t−1)-bit error is present, the locator polynomial value $$z^j=z^j[t,t-1]=\{0\}_m$$

is output at the m first outputs of the subcircuit $ST_j$, which here correspond to the outputs of the internal subcircuit 602 with the aid of which the locator polynomial values $L_t(\alpha^{ij})$ are provided.

If a (t−2)-bit error or a (t−3)-bit error is present, the locator polynomial value $$z^j = z^j[t-2, t-3] = \{0\}_m$$

is output at the m second outputs of the subcircuit $ST_j$, which here correspond to the outputs of the internal subcircuit 603 with the aid of which the locator polynomial values $L_{t-2}(\alpha^{ij})$ are provided.

These explanations can be correspondingly continued for bit errors t−q and t−q−1 where q=4, 6, 8, . . . until the 1-bit errors are finally reached (see following point).

If a 1-bit error is present, the locator polynomial value $$z^j = z^j[1] = \{0\}_m$$

is output at the m (t+1)/2th outputs of the subcircuit $ST_j$, which here correspond to the outputs of the internal subcircuit 604 with the aid of which the locator polynomial values $L_1(\alpha^{ij})$ are provided.

If the bit $v'_1$ is not erroneous, it holds true that:

if a t-bit error or a (t−1)-bit error is present, the locator polynomial value $$z^j = z^j[t, t-1] \neq \{0\}_m$$

is output at the m first outputs of the subcircuit $ST_j$, which here correspond to the outputs of the internal subcircuit 602 with the aid of which the locator polynomial values $L_t(\alpha^{ij})$ are determined.

If a (t−2)-bit error or a (t−3)-bit error is present, the locator polynomial value $$z^j = z^j[t-2, t-3] \neq \{0\}_m$$

is output at the m second outputs of the subcircuit $ST_j$, which here correspond to the outputs of the internal subcircuit 603 with the aid of which the locator polynomial values $L_{t-2}(\alpha^{ij})$ are determined.

These explanations can be correspondingly continued for bit errors t−q and t−q−1 where q=4, 6, 8, . . . until the 1-bit errors are finally reached (see following point).

If a 1-bit error is present, the locator polynomial value $$z^j = z^j[1] \neq \{0\}_m$$

is output at the m (t+1)/2th outputs of the subcircuit $ST_j$, which here correspond to the outputs of the internal subcircuit 604 with the aid of which the locator polynomial values $L_1(\alpha^{ij})$ are determined.

Depending on a number of the errors that have occurred, a value of the component err of the error signal provided by an error detection 609 of the selection unit 608 determines which of the inputs of the selection unit 608 is connected to the output thereof. The output of the selection unit 608 is connected to the first input of an AND gate 610. The component E of the error signal is present at the second input of the AND gate 610, said component likewise being provided by the error detection 609. The output of the AND gate 610 provides the correction value $\Delta v_j$ for the possibly erroneous bit $v'_j$.

If a t-bit error or a (t−1)-bit error is present, the selection unit 608 connects its first input to its output and the value $z^j = z^j[t, t-1]$ provided at the output of the internal subcircuit 602 determines whether $\Delta v_j=1$ or $\Delta v_j=0$:

$\Delta v_j=1$ in the case where $z^j[t, t-1]=\{0\}_m$.
$\Delta v_j=0$ in the case where $z^j[t, t-1]\neq\{0\}_m$.

If a (t−2)-bit error or a (t−3)-bit error is present, the selection unit 608 connects its second input to its output and the value $z^j = z^j[t-2, t-3]$ provided at the output of the internal subcircuit 603 determines whether $\Delta v_j=1$ or $\Delta v_j=0$:

$\Delta v_j=1$ in the case where $z^j[t-2, t-3]=\{0\}_m$.
$\Delta v_j=0$ in the case where $z^j[t-2, t-3]\neq\{0\}_m$.

This consideration can correspondingly be continued for subsequent pairs of bit errors $$\{(t-5);(t-4)\},\{(t-7);(t-6)\},\ldots$$

until reaching the 1-bit error explained below.

If a 1-bit error is finally present, the selection unit 608 connects its (t+1)/2th input to its output and the value $z^j=z^j[1]$ provided at the output of the internal subcircuit 604 determines whether $\Delta v_j=1$ or $\Delta v_j=0$:

$\Delta v_j=1$ in the case where $z^j[1]=\{0\}_m$.
$\Delta v_j=0$ in the case where $z^j[1]\neq\{0\}_m$.

If no error is present, the value of the component E of the error signal is equal to zero (E=0) and it holds true that: $\Delta v_j=0$.

Figure 7:
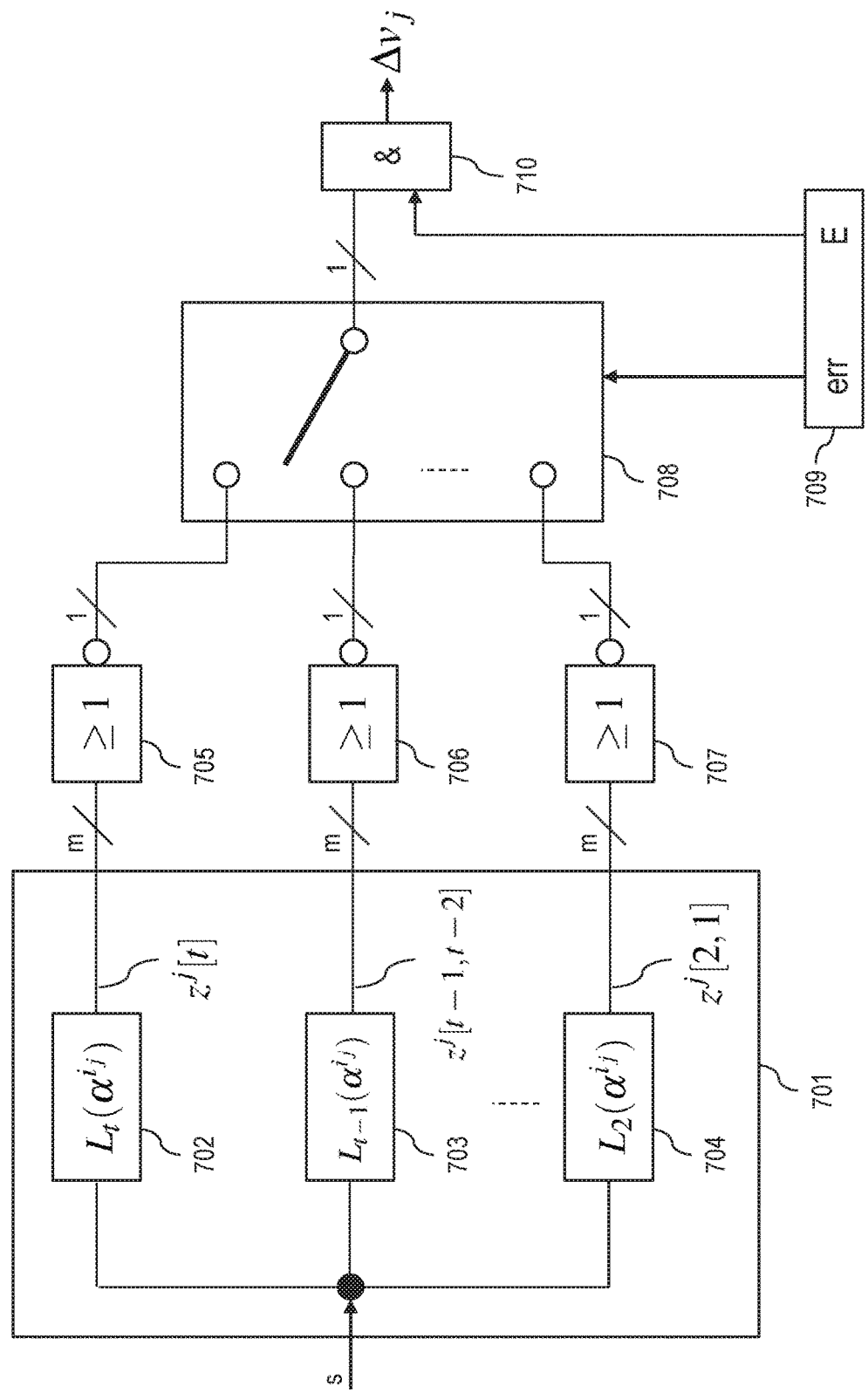
FIG. 7 shows a further possible implementation of a subcircuit for correcting a bit $v'_i$ using a t-bit error correcting code if t is an odd number.

FIG. 7 shows a further exemplary circuit arrangement for determining a correction value $\Delta v_j$ if the correction is effected using a t-bit error correcting BCH code. In this case, t is an odd number, for example.

FIG. 7 shows a subcircuit 701 (also designated as subcircuit $ST_j$ for the bit position j or the string j) having internal subcircuits 702 to 704. The subcircuit 701 has a t·m-bit-wide input, at which the error syndrome s with its t components $s_1, s_3, \ldots, s_{2t-1}$ is present.

The internal subcircuit 702 provides a locator polynomial value $L_t(\alpha^{ij})$ and outputs an m-dimensional value $$z^{j[t]}$$

at its m-dimensional output. The output of the internal subcircuit 702 is connected to an m-dimensional input of a NOR gate 705 having a 1-bit-wide output connected to the first input of a selection unit 708.

The internal subcircuit 703 provides a locator polynomial value $L_{t-1}(\alpha^{ij})$ and outputs an m-dimensional value $$z^j[t-1, t-2]$$

at its m-dimensional output. The output of the internal subcircuit 703 is connected to an m-dimensional input of a NOR gate 706 having a 1-bit-wide output connected to the second input of a selection unit 708.

The internal subcircuit 704 provides a locator polynomial value $L_2(\alpha^{ij})$ and outputs an m-dimensional value $$z^j[2,1]$$

at its m-dimensional output. The output of the internal subcircuit 704 is connected to an m-dimensional input of a NOR gate 707 having a 1-bit-wide output connected to the (t+1)/2th input of a selection unit 708.

Depending on a number of the errors that have occurred, a value of the component err of the error signal provided by an error detection 709 of the selection unit 708 determines which of the inputs of the selection unit 708 is connected to the output thereof. The output of the selection unit 708 is connected to the first input of an AND gate 710. The component E of the error signal is present at the second input of the AND gate 710, said component likewise being provided by the error detection 709. The output of the AND gate 710 provides the correction value $\Delta v_j$ for the possibly erroneous bit $v'_j$.

If a t-bit error is present, the selection unit 708 connects its first input to its output and the value $z^j=z^j[t]$ provided at the output of the internal subcircuit 702 determines whether $\Delta v_j=1$ or $\Delta v_j=0$:

$\Delta v_j=1$ in the case where $z^j[t]=\{0\}_m$.
$\Delta v_j=0$ in the case where $z^j[t]\neq\{0\}_m$.

If a (t−1)-bit error or a (t−2)-bit error is present, the selection unit 708 connects its second input to its output and the value $z^j=z^j$ [t−1, t−2] provided at the output of the internal subcircuit 703 determines whether $\Delta v_j=1$ or $\Delta v_j=0$:

$\Delta v_j=1$ in the case where $z^j[\text{t−1, t−2}]=\{0\}_m$.

$\Delta v_j=0$ in the case where $z^j[\text{t−1, t−2}]\neq\{0\}_m$.

This consideration can correspondingly be continued for subsequent pairs of bit errors $$\{(t-4);(t-3)\},\{(t-6);(t-5)\},\ldots$$

until reaching the pair of the 2-bit error and 1-bit error explained below.

If a 2-bit error or a 1-bit error is finally present, the selection unit 608 connects its (t+1)/2th input to its output and the value $z^j=z^j[2,1]$ provided at the output of the internal subcircuit 704 determines whether $\Delta v_j=1$ or $\Delta v_j=0$:

$\Delta v_j=1$ in the case where $z^j[2,1]=\{0\}_m$.

$\Delta v_j=0$ in the case where $z^j[2,1]\neq\{0\}_m$.

If no error is present, the value of the component E of the error signal is equal to zero (E=0) and it holds true that: $\Delta v_j=0$.

While the values output by the internal subcircuits for the locator polynomial values $$L_r(\alpha^{ij}) \text{ for } r=t-1,t-3,\ldots$$

determine for r-bit errors and (r−1)-bit errors whether $\Delta v_j=1$ or $\Delta v_j=0$, for example the value output by the internal subcircuit for the locator polynomial value $L_t(\alpha^{ij})$ determines only in the case of a t-bit error whether $\Delta v_j=1$ or $\Delta v_j=0$.

Figure 8A:
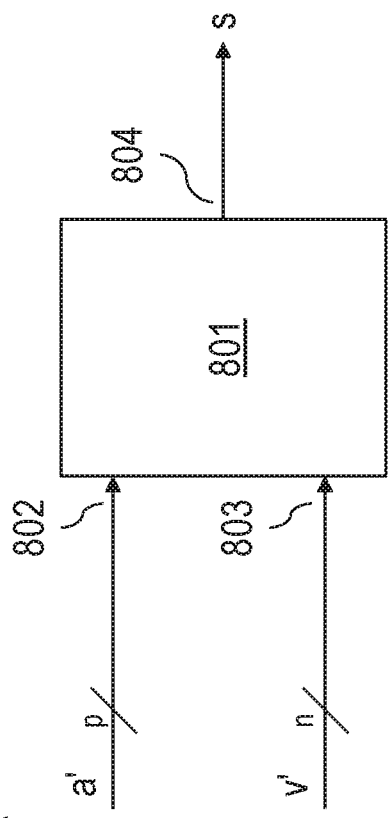
FIG. 8a shows a syndrome generator which determines an error syndrome from the possibly erroneous bits and address bits to be corrected.

FIG. 8a shows a syndrome generator 801 having a p-bit-wide input 802 and an n-bit-wide input 803. A possibly erroneous read address a' (address bits) is present at the input 802 and possibly erroneous data and check bits $v'_1, \ldots, v'_n$ are present at the input 803. Furthermore, the syndrome generator 801 has an output 804, at which the error syndrome s with its t components $s_1, s_3, \ldots, s_{2t-1}$ is provided.

Here the address bits, the data bits and the check bits in the error-free case form a code word of the t-bit error correcting code.

Figure 8B:
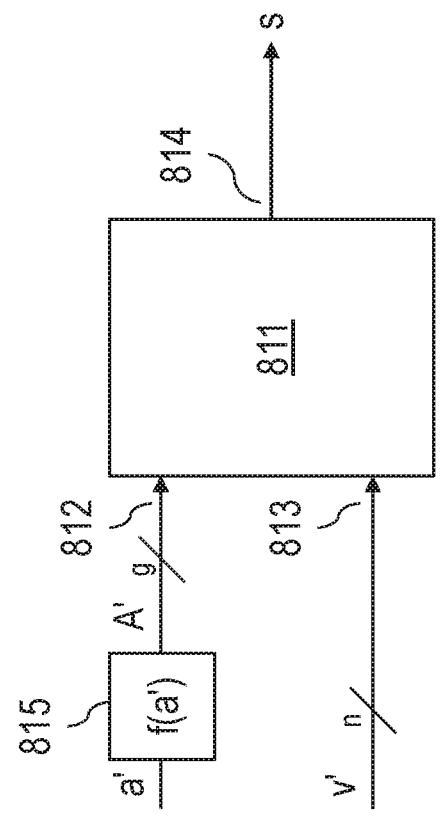
FIG. 8b shows a syndrome generator which determines an error syndrome from the possibly erroneous bits and bits derived from address bits to be corrected.

FIG. 8b shows a syndrome generator 811 having a g-bit-wide input 812 and an n-bit-wide input 813.

Bits of a possibly erroneous read address a' (address bits) are converted into bits $A'=A'_1, \ldots, A'_g$ derived from address bits by a unit 815, wherein the unit 815 provides a relationship $A'=f(a')$.

Possibly erroneous data and check bits $v'_1, \ldots, v'_n$ are present at the input 813. Furthermore, the syndrome generator 811 has an output 814, at which the error syndrome s with its t components $s_1, s_3, \ldots, s_{2t-1}$ is provided.

Here the bits A' derived from the address bits a' and the data and check bits in the error-free case form a code word of the t-bit error correcting code under consideration.

The function $f$ provided by the unit 815 maps the p bits $a'_1, \ldots, a'_p$ of the p-bit-wide possibly erroneous read address into g bits $A'_1, \ldots, A'_g$ derived from the read address, wherein p is the word width of the read address and $g\geq 1$ holds true.

If g=1, for example, then it is possible that, from the p bits of the read address, the parity of these bits is determined as a derived bit, such that it holds true that:

$$A'_1=f(a'_1,\ldots,a'_p)=a'_1+a'_2+\ldots+a'_p.$$

Circuit parts of the solution presented here are explained by way of example below. In the example, m=5 is chosen, such that the underlying Galois field is $GF(2^m)=GF(2^5)=GF(32)$.

Elements of the Galois field GF(32) are illustrated in their various forms of notation in FIG. 10. The modular polynomial of the Galois field GF(32) is the polynomial $$m(x)=1+x^2+x^5.$$

The 32 elements of the Galois field are contained in the first column of the table shown in FIG. 10 for i=0, ..., 30 in their power notation $\alpha^i$. The power notation can also be designated as exponent notation or as exponential notation.

The element 0 in the first row of the first column has no power notation. Here $\alpha$ is a primitive element of the Galois field. The second column of the table indicates the 32 elements of the Galois field in their polynomial notation for the modular polynomial $m(x)=1+x^2+x^5$, and the third column illustrates the tuple or vector notation. The five components of the vector notation correspond to the five coefficients of the powers $x^0, x^1, x^2, x^3, x^4$ of the polynomial notation. In this regard, the vector notation 00101 corresponds for example to the polynomial $x^2+x^4$ in the 9th row of the table.

The corresponding polynomial notation results from the power notation $\alpha^j$ by determining $$x^j \text{modulo}(1+x^2+x^5).$$

In this regard, the polynomial notation of $\alpha^5$ is equal to $1+x^2$ since $$x^5 \text{modulo}(1+x^2+x^5)=1+x^2$$

holds true. Correspondingly, the polynomial notation of $\alpha^6$ is equal to $x+x^3$, of $\alpha^7$ is equal to $x^2+x^4$ and of $\alpha^8$ is equal to $(x^3+x^5)$ modulo $(1+x^2+x^5)=1+x^2+x^3$ as indicated in the table shown in FIG. 10.

The multiplication of two elements of the Galois field can be carried out in the exponent notation or in the polynomial notation.

Given two elements of the Galois field $GF(2^5)$ in the exponent notation $\alpha^i$ and $\alpha^j$, their product is $$\alpha^i \cdot \alpha^j=\alpha^k \text{ where } k=(i+j)\text{modulo}(2^m-1)=(i+j)\text{modulo} \quad (31).$$

If the elements of the Galois field that are to be multiplied are present in their vector notation or in their polynomial notation, their multiplication can be carried out by a Galois field multiplier, wherein a Galois field multiplier is also designated as multiplier.

The multiplication of two elements in their polynomial notation is explained below.

In order to multiply two elements by one another and if the elements of the Galois field $GF(2^m)=GF(2^5)$ are given in their polynomial notation, then the polynomials are to be multiplied directly by one another and the result is to be determined modulo of the modular polynomial: If the polynomials $1+x^2+x^3$ and $x+x^3$ are given, for example, then their direct multiplication results in $$(1+x^2+x^3)(x+x^3)=x+x^4+x^5+x^6.$$

Owing to $$x^5=1+x^2\text{modulo}(1+x^2+x^5) \text{ and}$$

$$x^6=x+x^3\text{modulo}(1+x^2+x^5)$$

it follows that $$x+x^4+x^5+x^6=x+x^4+1+x^2+x+x^3=1+x^2+x^3+x^4.$$

Consequently, as a result it holds true that:

$$(1+x^2+x^3)\cdot(x+x^3)=1+x^2+x^3+x^4.$$

A description is given below of the case according to which a first element a(x) where $$a(x)=a_4x^4+a_3x^3+a_2x^2+a_1x+a_0$$

and a second element $b(x)$ where $$b(x)=b_4x^4+b_3x^3+b_2x^2+b_1x+b_0$$

in the Galois field $GF(2^5)$ with the modular polynomial $$m(x)=x^5+x^2+1$$

are multiplied. By directly multiplying out the polynomials $a(x)$ and $b(x)$, firstly a polynomial of 8th degree results. With $$x^5 \bmod (1+x^2+x^5)=1+x^2,$$

$$x^6 \bmod (1+x^2+x^5)=x+x^3,$$

$$x^7 \bmod (1+x^2+x^5)=x^2+x^4,$$

$$x^8 \bmod (1+x^2+x^5)=1+x^2+x^3$$

a polynomial of fourth degree results as follows:

$$c_4x^4 + c_3x^3 + c_2x^2 + c_1x^1 + c_0 = a(x) \cdot b(x) \bmod m(x) ==$$
$$(a_0b_4 + a_1b_3 + a_2b_2 + a_3b_1 + a_3b_4 + a_4b_0 + a_4b_3) \cdot x^4 ++$$
$$(a_0b_3 + a_1b_2 + a_2b_1 + a_2b_4 + a_3b_0 + a_3b_3 + a_4b_2 + a_4b_4) \cdot x^3 ++$$
$$(a_0b_2 + a_1b_1 + a_1b_4 + a_2b_0 + a_2b_3 + a_3b_2 + a_3b_4 + a_4b_1 + a_4b_3 + a_4b_4) \cdot x^2 ++ (a_0b_1 + a_1b_0 + a_2b_4 + a_3b_3 + a_4b_2) \cdot x^1 ++$$
$$(a_0b_0 + a_1b_4 + a_2b_3 + a_3b_2 + a_4b_1 + a_4b_4)$$

This relationship is realized by a Galois field multiplier having five first binary inputs, five second binary inputs and five binary outputs. This is explained in greater detail below.

The binary values $a_0$, $a_1$, $a_2$, $a_3$, $a_4$ are present at the first five inputs of the Galois field multiplier and the binary values $b_0$, $b_1$, $b_2$, $b_3$, $b_4$ are present at the second five inputs, while the values $c_0$, $c_1$, $c_2$, $c_3$, $c_4$ where $$(a_0b_0+a_1b_4+a_2b_3+a_3b_2+a_4b_1+a_4b_4)=c_0, \qquad (44)$$

$$(a_0b_1+a_1b_0+a_2b_4+a_3b_3+a_4b_2)=c_1, \qquad (45)$$

$$(a_0b_2+a_1b_1+a_1b_4+a_2b_0+a_2b_3+a_3b_2+a_3b_4+a_4b_1+a_4b_3+a_4b_4)=c_2, \qquad (46)$$

$$(a_0b_3+a_1b_2+a_2b_1+a_2b_4+a_3b_0+a_3b_3+a_4b_2+a_4b_4)=c_3, \qquad (47)$$

$$(a_0b_4+a_1b_3+a_2b_2+a_3b_1+a_3b_4+a_4b_0+a_4b_3)=c_4 \qquad (48)$$

are output at the five binary outputs. Here the symbol "+" denotes addition modulo 2 (XOR operation).

The implementation of equations (44) to (48) can be effected by means of a Galois field multiplier. By way of example, a synthesis tool can also be used in the context of the implementation.

If an element of the Galois field is squared, then it is to be multiplied by itself. If in the polynomial notation an element is given as a polynomial $$a(x)=a_0+a_1x^1+a_2x^2+a_3x^3+a_4x^4$$

then it holds true that $$(a(x))^2 \bmod m(x) ==$$
$$[a_0 + a_1x^2 + a_2x^4 + a_3x^6 + a_4x^8] \bmod (1 + x^2 + x^5) ==$$
$$(a_2)x^4 + (a_3 + a_4)x^3 + (a_1 + a_4)x^2 + a_3x^1 + (a_0 + a_4).$$

The squaring of an element in the Galois field $GF(2^5)$ can correspondingly be realized by a squaring unit having five binary inputs and five binary outputs. The binary values $a_0$, $a_1$, $a_2$, $a_3$, $a_4$ are fed to the five binary inputs and the binary values $d_0$, $d_1$, $d_2$, $d_3$, $d_4$ are provided at the five binary outputs. It holds true here that:

$$a_0+a_4=d_0, \qquad (49)$$

$$a_3=d_1, \qquad (50)$$

$$a_1+a_4=d_2, \qquad (51)$$

$$a_3+a_4=d_3, \qquad (52)$$

$$a_2=d_4, \qquad (53)$$

wherein the symbol "+" once again denotes addition modulo 2 (XOR function).

In order to realize a squaring unit in the Galois field $GF(2^5)$ with the modular polynomial $m(x)=1+x^2+x^5$, equations (49) to (53) can be implemented by means of XOR gates, for example.

On the basis of the example of the Galois field $GF(2^5)$, a description is given of how the third power of an element which is indicated in its polynomial notation can be determined.

If the third power $(a(x))^3$ of a polynomial $$a(x)=a_0+a_1x^1+a_2x^2+a_3x^3+a_4x^4$$

is determined modulo of the modular polynomial $m(x)=1+x^2+x^5$, it holds true that:

$$(a(x))^3 \bmod m(x) ==$$
$$(a_0a_2 + a_0a_4 + a_1a_2 + a_1a_3 + a_1a_4 + a_2a_3 + a_2a_4 + a_3 + a_3a_4) \cdot x^4 ++$$
$$(a_0a_4 + a_1 + a_2 + a_2a_3 + a_2a_4 + a_3 + a_4) \cdot x^3 ++$$
$$(a_0a_1 + a_0a_2 + a_0a_4 + a_1a_2 + a_2a_4 + a_3a_4 + a_4) \cdot x^2 ++$$
$$(a_0a_1 + a_0a_3 + a_2 + a_3 + a_3a_4 + a_4) \cdot x^1 ++$$
$$(a_0 + a_0a_4 + a_1a_2 + a_1a_3 + a_2a_3)$$

The formation of the third power of an element in the Galois field $GF(2^5)$ can correspondingly be realized by a third power forming unit having five binary inputs and five binary outputs. The binary values $a_0$, $a_1$, $a_2$, $a_3$, $a_4$ are fed to the five binary inputs and the binary values $f_0$, $f_1$, $f_2$, $f_3$, $f_4$ are provided at the five binary outputs. It holds true that:

$$f_0=a_0+a_0a_4+a_1a_2+a_1a_3+a_2a_3 \qquad (54)$$

$$f_1=a_0a_1+a_0a_3+a_2+a_3+a_3a_4+a_4 \qquad (55)$$

$$f_2=a_0a_1+a_0a_2+a_0a_4+a_1a_2+a_2a_4+a_3a_4+a_4 \qquad (56)$$

$$f_3=a_0a_4+a_1+a_2+a_2a_3+a_2a_4+a_3+a_4 \qquad (57)$$

$$f_4=a_0a_2+a_0a_4+a_1a_2+a_1a_3+a_1a_4+a_2a_3+a_2a_4+a_3+a_3a_4 \qquad (58)$$

By way of example, it is possible to realize a third power forming unit, in the present example in the Galois field $GF(2^5)$ with the modular polynomial $m(x)=1+x^2+x^5$, merely by implementing equations (54) to (58).

Alternatively, it is possible to realize a third power forming unit from a squaring unit and a Galois field multiplier connected downstream. Higher powers of the element $a(x)$ are also realized in a corresponding manner using suitable components.

Moreover, there may be exemplary embodiments in which an inverter is used. FIG. 11 shows an exemplary table comprising a table of values of an inverter for the Galois field $GF(2^5)$.

The first column of the table shown in FIG. 11 shows all $2^5-1$ values $\alpha^j$ where $i=0, \ldots, 30$ of the Galois field $GF(2^5)$ in the exponent notation. The 0 element of the Galois field is not entered. It has no inverse element.

The second column contains the element illustrated in the first column in its tuple notation as binary 5-tuple. This tuple notation is also contained in the table shown in FIG. 10.

The third column contains the inverse element of the element illustrated in the first column in its exponent notation and the fourth column contains the inverse element illustrated in the third column in its tuple notation in the form of a binary 5-tuple.

If the element illustrated in the first column is multiplied by the corresponding inverse element in the third column, this results in $\alpha^0=1$. For the sum of the exponents of an element and of the associated inverse element it holds true that modulo 31 is equal to 0. Correspondingly, the exponent of the inverse element can be determined such that the sum of the exponent of the element in the first column and the element in the third column of the table shown in FIG. 11 is equal to 31 or according to the first row of the table is equal to 0.

By way of example, for the tenth row of the table shown in FIG. 11 it holds true that: The element $\alpha^9$ is assigned the inverse element $\alpha^{22}$; for the exponents of the two elements it holds true that: $22+9=31$.

By way of example, for the first row of the table shown in FIG. 11 it holds true that: The element $\alpha^0$ is assigned the inverse element $\alpha^0$; for the exponents of the two elements it holds true that: $0+0=0$.

If the input value of the inverter is indicated in the same way as the output value as a 5-tuple in the respective tuple notation, a table of values for the binary realization of the inverter results by assigning the 5-tuples in the second column to the corresponding 5-tuples in the fourth column. In this case, the 5-tuples in the second column are the input values and the 5-tuples in the fourth column are the output values of the inverter.

In this regard, by way of example, the input tuple 01011 in the 10th row of the table shown in FIG. 11 is assigned the output tuple 10101.

An implementation of a (constant) multiplier in the Galois field $GF(2^m)$ is illustrated below by way of example for $m=5$. The modular polynomial is $$m(x)=1+x^2+x^5.$$

Let $a \in GF(2^5)$ be an arbitrary element of the Galois field with the following polynomial notation $$a(x)=a_0+a_1x+a_2x^2+a_3x^3+a_4x^4. \quad (59)$$

As constant to be multiplied, for example $\alpha^9$ is chosen, the polynomial notation of which is given according to the table shown in FIG. 10 by $$\alpha^9(x)=x+x^3+x^4 \quad (60)$$

As multiplication this results in $$a(x)\cdot\alpha^9(x)\,\mathrm{modulo}(1+x^2+x^5)=b_0+b_1x+b_2x^2+b_3x^3+b_4x^4 \quad (61)$$

where $$b_0=a_1+a_2 \quad (62)$$

$$b_1=a_0+a_2+a_3 \quad (63)$$

$$b_2=a_2+a_3+a_4 \quad (64)$$

$$b_3=a_0+a_3+a_4 \quad (65)$$

$$b_4=a_0+a_1+a_4 \quad (66)$$

The output values $b_0, \ldots, b_4$ are derived from the input values $a_0, \ldots, a_4$ in accordance with the relationships presented in equations (62) to (66), such that the output values are determined from the input values by XORings. In this case, the symbol "+" denotes addition modulo 2 (XOR operation). The multiplier can correspondingly be realized by means of XOR gates.

Figure 9:
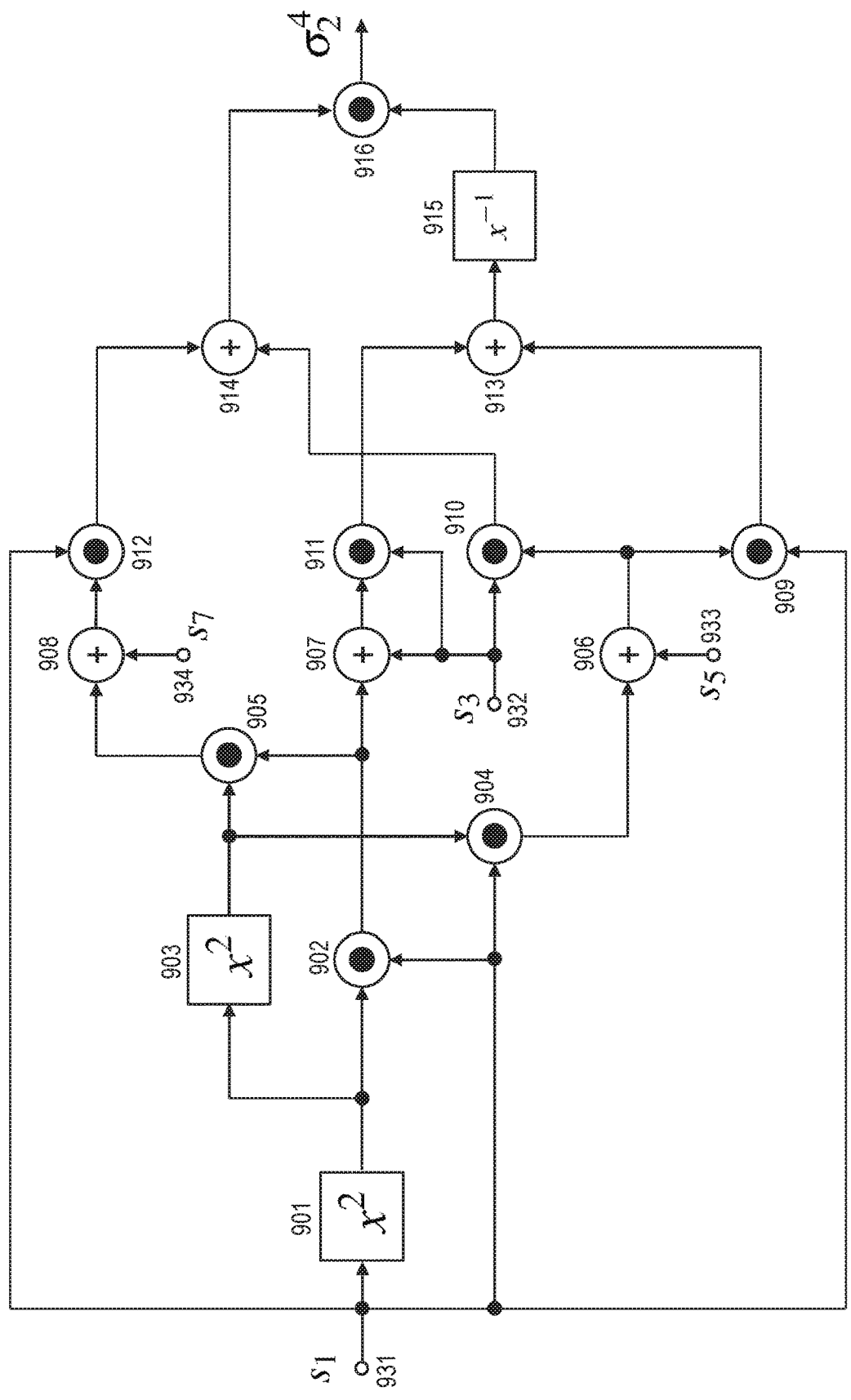
FIG. 9 shows one exemplary embodiment of a circuit arrangement for determining a coefficient of a locator polynomial using Galois field multipliers, adders and an inverter in the Galois field.

FIG. 9 shows an exemplary realization of the unit 306 from FIG. 3, which, depending on the partial syndromes $s_1$, $s_3$, $s_5$ and $s_7$ present at its four m-bit-wide inputs, determines the coefficient $\sigma_2^4$ of the locator polynomial of 4-th degree $L_4(x)$ where $$\sigma_2^4 = \frac{s_1s_7+s_3s_5+s_1^5(s_3+s_1^3)}{s_1s_5+s_3^2+s_1^3s_3+s_1^6} = \frac{s_1(s_1^7+s_7)+s_3(s_1^5+s_5)}{s_3(s_1^3+s_3)+s_1(s_1^5+s_5)} \quad (67)$$

and provides it at the m-bit-wide output of said unit.

The circuit arrangement shown in FIG. 9 has components which are used for adding, squaring, multiplying and inverting elements of a Galois field $GF(2^m)$. In this regard, the unit 306 comprises (Galois field) squaring units 901 and 903 each having an m-bit-wide input and an m-bit-wide output, (Galois field) multipliers 902, 904, 905, 909, 910, 911, 912 and 916 each having two m-bit-wide inputs and an m-bit-wide output, (Galois field) adders (which can be realized e.g. from m XOR gates each having two inputs and an output) 906, 907, 908, 913, 914 each having two m-bit-wide inputs and an m-bit-wide output, and a (Galois field) inverter 915 having an m-bit-wide input and an m-bit-wide output.

The circuit arrangement has four m-bit-wide inputs 931 to 934, wherein the partial syndrome $s_1$ is present at the input 931, the partial syndrome $s_3$ is present at the input 932, the partial syndrome $s_5$ is present at the input 933, and the partial syndrome $s_7$ is present at the input 934. These are provided by the syndrome generator 101 (not shown in FIG. 9).

The input 931 provides the value of the partial syndrome $s_1$ to the input of the squaring unit 901, to the first input of the multiplier 912, to the first input of the multiplier 902, to the first input of the multiplier 904 and to the first input of the multiplier 909. The output of the squaring unit 901 provides a value $s_1^2$ and is connected to the input of the squaring unit 903 and to the second input of the multiplier 902.

The output of the multiplier 902 provides a value $s_1^3$ to the first input of the multiplier 905 and to the first input of the XOR gate 907.

The output of the squaring unit 903 is connected to the second input of the multiplier 905 and to the second input of the multiplier 904 and provides the value $s_1^4$ to them.

The output of the multiplier 904 is connected to the first input of the XOR gate 906 and feeds the value $s_1^5$ to it. The second input of the XOR gate 906 is connected to the input 933, at which the partial syndrome $s_5$ is present.

The output of the multiplier 905 passes the value $s_1^7$ to the first input of the XOR gate 908. The second input of the XOR gate 908 is connected to the input 934, at which the partial syndrome $s_7$ is present.

The output of the XOR gate 908 passes the value $s_1^7+s_7$ to the second input of the multiplier 912. The output of the multiplier 912 passes the $s_1(s_1^7+s_7)$ to the first input of the XOR gate 914.

The input 932 provides the partial syndrome $s_3$ and is connected to the second input of the XOR gate 907, to the first input of the multiplier 911 and to the first input of the multiplier 910.

The output of the XOR gate 906 carries the value $s_1^5+s_5$ and is connected to the second input of the multiplier 910 and to the second input of the multiplier 909.

The output of the multiplier 910 is connected to the second input of the XOR gate 914. The output of the XOR gate 914 carries the signal $s_1(s_1^7+s_7)+s_3(s_1^5+s_5)$ and is connected to the first input of the multiplier 916.

The output of the XOR gate 907 passes the value $s_1^3+s_3$ to the second input of the multiplier 911. The output of the multiplier 911 is connected to the first input of the XOR gate 913.

The output of the multiplier 909 passes the value $s_1(s_1^5+s_5)$ to the second input of the XOR gate 913. The output of the XOR gate 913 carries the value $s_1(s_1^5+s_5)+s_3(s_1^3+s_3)$ and is connected to the input of the inverter 915.

In this case, the inverter is configured for a Galois field $GF(2^m)$ with the primitive element $\alpha$ such that, for an element of $\alpha^j$ where i={0, 1, ..., $2^{m-2}$} that is present at the input of said inverter, said inverter provides the inverse element of $a^{-i}$ at its output, such that the following holds true:

$$\alpha^i \cdot \alpha^{-i} = \alpha^0 = 1.$$

The output of the inverter, which carries the value $[s_1(s_1^5+s_5)+s_3(s_1^3+s_3)]^{-1}$, is connected to the second input of the multiplier 916. The coefficient $\sigma_2^4$ is output at the output of the multiplier 916.

The invention claimed is:

1. A circuit arrangement for determining a correction signal based on at least one bit error of a binary word, comprising:
   a plurality of subcircuits (ST), wherein a respective subcircuit is provided for a bit position to be corrected of the binary word,
   wherein each of the subcircuits provides at least two locator polynomial values, and
   a selection circuit configured to determine a correction signal depending on the locator polynomial values and depending on an error signal (err, E) that comprises a first component (err) and a second component (E), wherein the selection circuit is operationally configured to determine the correction signal downstream of outputs of the plurality of subcircuits, such that the selection circuit is arranged downstream of the subcircuits, wherein the outputs of the plurality of subcircuits are input into the selection circuit and the correction signal is output downstream of the plurality of subcircuits.

2. The circuit arrangement as claimed in claim 1, wherein a number of T bit positions of the binary word are correctable, wherein the number T is greater than a number of t-bit errors, and wherein the t-bit errors are correctable by means of an error code.

3. The circuit arrangement as claimed in claim 2, wherein the number of t-bit errors of correctable bit errors is greater than or equal to four.

4. The circuit arrangement as claimed in claim 1, wherein each subcircuit has at least two internal subcircuits, wherein each internal subcircuit provides a locator polynomial value.

5. The circuit arrangement as claimed in claim 1, wherein the at least one bit error is corrected by means of the correction signal.

6. The circuit arrangement as claimed in claim 5, wherein the at least one bit error is corrected with the aid of a logical combination circuit for logically combining the at least one bit position to be corrected and the correction signal by virtue of the fact that bits respectively to be corrected are logically combined with the corresponding correction values bijectively to form corrected bits.

7. The circuit arrangement as claimed in claim 1, wherein the correction signal is determined in parallel or substantially in parallel by at least two subcircuits.

8. The circuit arrangement as claimed in claim 1, wherein the first component (err) indicates a number ($\tau$) of erroneous bits, and the second component (E) assumes a first value if an error was detected, and the second component (E) assumes a second, different value if no error was detected.

9. The circuit arrangement as claimed in claim 1, wherein each of the subcircuits provides at most t−2 locator polynomial values, wherein t indicates the number of bit errors correctable by means of an error code.

10. The circuit arrangement as claimed in claim 1, wherein each of the subcircuits provides t/2 locator polynomial values if the number of bit errors is even, and provides (t+1)/2 locator polynomial values if the number of bit errors is odd, wherein t denotes the number of bit errors correctable by means of an error code.

11. The circuit arrangement as claimed in claim 9, wherein the error code is a t-bit error correcting BCH code over the Galois field $GF(2_m)$ and the locator polynomial values are m-digit binary values and m is greater than or equal to 4.

12. The circuit arrangement as claimed in claim 11, wherein the error signal comprises a number of the bit errors that occurred, wherein this number is determined with the aid of an error syndrome of the BCH code.

13. The circuit arrangement as claimed in claim 11, wherein the BCH code is supplemented by at least one parity bit.

14. The circuit arrangement as claimed in claim 11, wherein code words of the BCH code comprise:
   data bits, address bits and check bits,
   data bits, bits derived from address bits, and check bits, or
   data bits and check bits.

15. The circuit arrangement as claimed in claim 1, wherein the selection circuit per subcircuit using the locator polynomial values
   determines a first correction signal if no error occurred at the bit position associated with the subcircuit, and
   determines a second correction signal if at least one error occurred at the bit position associated with the subcircuit,
   wherein the correction signal is determined with the aid of the first correction signal and the second correction signal per subcircuit.

16. The circuit arrangement as claimed in claim 1, wherein more than four subcircuits are provided.

17. The circuit arrangement as claimed in claim 1, wherein at least one syndrome component is provided for each of the subcircuits.

18. The circuit arrangement as claimed in claim 1, wherein the at least two locator polynomial values are concentrated on one bit by means of a concentrating unit.

19. The circuit arrangement as claimed in claim 18, wherein the concentrating unit comprises at least one gate comprising an OR gate or a NOR gate.

20. The circuit arrangement as claimed in claim 18, wherein the concentrating unit is arranged upstream of the selection circuit or downstream of the selection circuit.

21. The circuit arrangement as claimed in claim 1, wherein the selection circuit comprises:
    a multiplexer configured to select one of the locator polynomial values per subcircuit, and
    a masking unit configured to mask the locator polynomial values per subcircuit.

22. The circuit arrangement as claimed in claim 1, wherein the subcircuits and/or the selection circuit are/is part of at least one integrated circuit.

23. The circuit arrangement as claimed in claim 1, wherein the error signal is provided by an error detection.

24. The circuit arrangement as claimed in claim 1, comprising circuit parts which are jointly realized at least in part.

25. The circuit arrangement as claimed in claim 1, which was optimized by means of a synthesis tool.

26. A method for determining a correction signal based on at least one bit error of a binary word, comprising:
    determining at least two locator polynomial values using a subcircuit for a bit position to be corrected of the binary word, and
    determining, via a selection circuit, a correction signal depending on the locator polynomial values and depending on an error signal (err, E) that comprises a first component (err) and a second component (E), wherein the correction signal is determined after determining the at least two locator polynomial values, wherein an output of subcircuit is input into the selection circuit and the correction signal is output downstream of the subcircuit.

27. The method as claimed in claim 26, wherein the correction signal is determined in parallel or substantially in parallel by at least two subcircuits.

* * * * *